United States Patent
Oh et al.

(10) Patent No.: US 10,236,032 B2
(45) Date of Patent: Mar. 19, 2019

(54) MASS DATA STORAGE SYSTEM WITH NON-VOLATILE MEMORY MODULES

(75) Inventors: HakJune Oh, Kanata (CA); Jin-Ki Kim, Kanata (CA)

(73) Assignee: Novachips Canada Inc., Ottawa (CA)

( * ) Notice: Subject to any disclaimer, the term of this patent is extended or adjusted under 35 U.S.C. 154(b) by 2328 days.

(21) Appl. No.: 12/212,902

(22) Filed: Sep. 18, 2008

(65) Prior Publication Data

US 2010/0067278 A1    Mar. 18, 2010

(51) Int. Cl.
*G11C 5/04* (2006.01)
*G11C 5/02* (2006.01)
*G11C 7/10* (2006.01)

(52) U.S. Cl.
CPC .................. *G11C 5/04* (2013.01); *G11C 5/02* (2013.01); *G11C 7/1003* (2013.01); *G06F 2212/205* (2013.01)

(58) Field of Classification Search
None
See application file for complete search history.

(56) References Cited

U.S. PATENT DOCUMENTS

| | | |
|---|---|---|
| 4,656,605 A | 4/1987 | Clayton |
| 4,885,482 A | 12/1989 | Sharp et al. |
| 5,184,282 A | 2/1993 | Kaneda et al. |
| 5,200,917 A | 4/1993 | Shaffer et al. |
| 5,229,960 A | 7/1993 | De Givry |
| 5,274,800 A * | 12/1993 | Babb ..................... G06F 13/37 714/32 |
| 5,430,859 A | 7/1995 | Norman et al. |
| 5,495,435 A | 2/1996 | Sugahara |
| 5,513,135 A | 4/1996 | Dell et al. |

(Continued)

FOREIGN PATENT DOCUMENTS

| | | |
|---|---|---|
| CN | 1589428 | 3/2005 |
| JP | 10177427 | 6/1998 |

(Continued)

OTHER PUBLICATIONS

International Search Report dated Dec. 4, 2009 in connection with corresponding International Patent Application No. PCT/CA2009/001195, 3 pages.

(Continued)

*Primary Examiner* — Jared I Rutz
*Assistant Examiner* — Marwan Ayash
(74) *Attorney, Agent, or Firm* — Borden Ladner Gervais LLP

(57) ABSTRACT

A mass data storage system, which comprises: a controller for issuing and receiving signals to carry out memory operations; a motherboard comprising at least one first connector and providing signal pathways for establish a ring from the controller via each of the at least one first connector and back to the controller; and at least one non-volatile memory module comprising a second connector electrically connected to a chain of non-volatile memory devices, wherein mating of the second connector with a given one of the at least one first connector causes the chain of non-volatile memory devices to be inserted into the ring, thereby to allow the controller to carry out the memory operations on the non-volatile memory devices in the chain.

15 Claims, 14 Drawing Sheets

(56) References Cited

U.S. PATENT DOCUMENTS

| | | | |
|---|---|---|---|
| 5,587,954 | A | 12/1996 | Vogley et al. |
| 5,621,678 | A | 4/1997 | Barnaby et al. |
| 5,778,419 | A | 7/1998 | Hansen et al. |
| 5,822,251 | A | 10/1998 | Bruce et al. |
| 5,867,417 | A | 2/1999 | Wallace et al. |
| 6,034,878 | A | 3/2000 | Osaka et al. |
| 6,111,757 | A | 8/2000 | Dell et al. |
| 6,144,576 | A * | 11/2000 | Leddige et al. ............... 365/63 |
| 6,234,829 | B1 | 5/2001 | Thomsen |
| 6,317,352 | B1 * | 11/2001 | Halbert et al. ............... 365/52 |
| 6,353,539 | B1 | 3/2002 | Horine et al. |
| 6,381,662 | B1 | 4/2002 | Harari et al. |
| 6,431,889 | B1 | 8/2002 | Olson |
| 6,480,409 | B2 | 11/2002 | Park et al. |
| 6,502,161 | B1 | 12/2002 | Perego et al. |
| 6,519,173 | B2 | 2/2003 | Funaba et al. |
| 6,625,687 | B1 | 9/2003 | Halbert et al. |
| 6,661,092 | B2 | 12/2003 | Shibata et al. |
| 6,683,372 | B1 | 1/2004 | Wong et al. |
| 6,772,261 | B1 | 8/2004 | D'Antonio et al. |
| 6,899,567 | B2 | 5/2005 | Konno |
| 7,102,905 | B2 | 9/2006 | Funaba et al. |
| 7,130,958 | B2 | 10/2006 | Chou et al. |
| 7,161,820 | B2 | 1/2007 | Funaba et al. |
| 7,200,023 | B2 | 4/2007 | Foster, Sr. |
| 7,210,955 | B2 | 5/2007 | Ringler et al. |
| 7,221,613 | B2 | 5/2007 | Pelley et al. |
| 7,227,796 | B2 | 6/2007 | Lee et al. |
| 7,242,635 | B2 | 7/2007 | Okuda |
| 7,254,675 | B2 | 8/2007 | Lee et al. |
| 7,274,583 | B2 | 9/2007 | Park et al. |
| 7,282,791 | B2 | 10/2007 | Funaba et al. |
| 7,288,005 | B2 | 10/2007 | Nagahashi |
| 7,324,352 | B2 | 1/2008 | Goodwin |
| 7,334,150 | B2 | 2/2008 | Ruckerbauer et al. |
| 7,342,816 | B2 | 3/2008 | Bartley et al. |
| 2002/0009929 | A1 * | 1/2002 | Miller ............... H01R 31/085 439/637 |
| 2002/0196612 | A1 * | 12/2002 | Gall et al. ............... 361/760 |
| 2004/0148482 | A1 * | 7/2004 | Grundy et al. ............... 711/167 |
| 2005/0120163 | A1 | 6/2005 | Chou et al. |
| 2005/0198449 | A1 * | 9/2005 | Haskell et al. ............... 711/156 |
| 2006/0200620 | A1 * | 9/2006 | Schnepper ............... 711/103 |
| 2007/0288683 | A1 | 12/2007 | Panabaker et al. |
| 2008/0002370 | A1 | 1/2008 | Lau et al. |
| 2008/0016269 | A1 | 1/2008 | Chow et al. |
| 2008/0034130 | A1 | 2/2008 | Perego et al. |
| 2008/0109619 | A1 | 5/2008 | Nakanishi |
| 2008/0201548 | A1 | 8/2008 | Przybylski et al. |

FOREIGN PATENT DOCUMENTS

| | | |
|---|---|---|
| WO | 2001097003 | 12/2001 |
| WO | 2008051940 | 5/2008 |
| WO | 2008074140 | 6/2008 |
| WO | 2008101246 | 8/2008 |

OTHER PUBLICATIONS

Written Opinion of the International Searching Authority dated Dec. 4, 2009 in connection with corresponding International Patent Application No. PCT/CA2009/001195, 5 pages.

IEEE Std 1596.4-1996, "IEEE Standard for High-Bandwidth Memory Interface Based on Scalable Coherent Interface (SCI) Signaling Technology (RamLink)", The Institute of Electrical and Electronics Engineers, Inc., 1996, 98 pages.

JEDEC Standard No. 21-C, "PC1600/2100 DDR SDRAM Registered DIMM, Design Specification, Rev. 1.2", JEDEC Solid State Technology Association, Feb. 2002, 69 pages.

"Intel Desktop Board, D5400XS, Technical Product Specification", Intel Corporation, Jan. 2008, 88 pages.

"Intel Z-P140 PATA Solid-State Drive, SSDPAPS0002G1, SSDPAPS0004G1, Preliminary Datasheet", Intel Corporation, Dec. 2007, 24 pages.

"Intel NAND Flash Memory for Intel Turbo Memory, White Paper, Intel Flash Memory", Intel Corporation, 2007, 8 pages.

JEDEC Standard No. 21C, "PC2-3200/PC2-4200/PC2-5300/PC2-6400 DDR2 SDRAM Unbuffered DIMM Design Specification, Rev. 1.1", JEDEC Solid State Technology Association, Jan. 5, 2005, 62 pages.

"Open NAND Flash Interface Specification, Rev. 2.0", Hynix Semiconductor, Intel Corporation, Micron Technology, Inc., Phison Electronics Corp., Sony Corporation, Spansion, STMicroelectronics, Feb. 27, 2008, 174 pages.

"240-Pin Fully-Buffered DDR2 SDRAM Modules DDR2 SDRAM RoHS Compliant Products, Internet Data Sheet, Rev. 1.2", Qimonda AG, Dec. 2006, 42 pages.

European Application No. 09813922, Supplementary European Search Report dated Apr. 25, 2012.

* cited by examiner

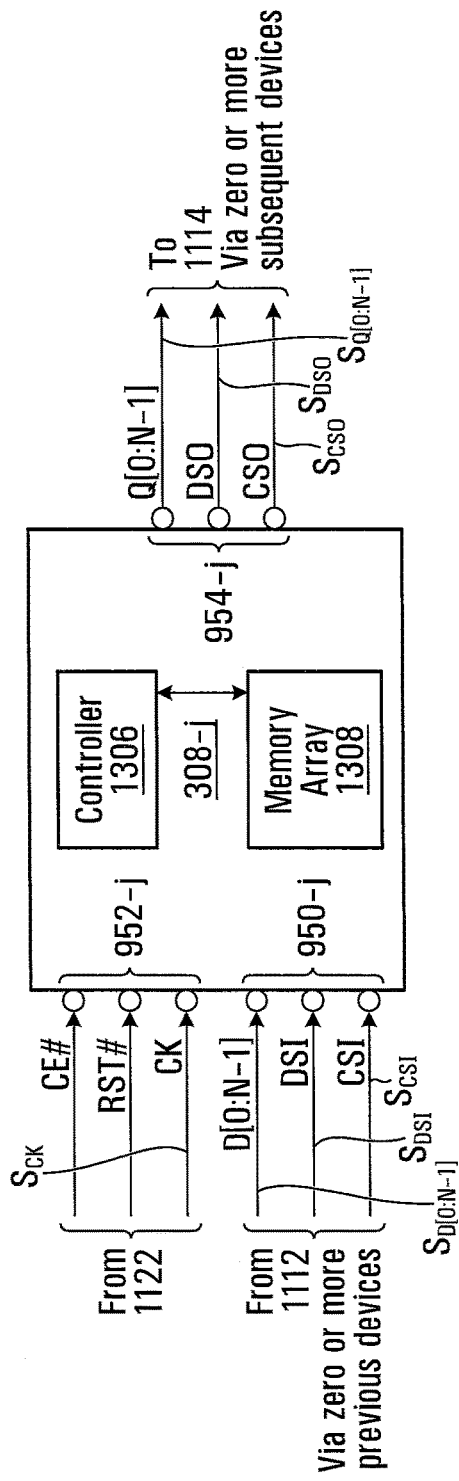
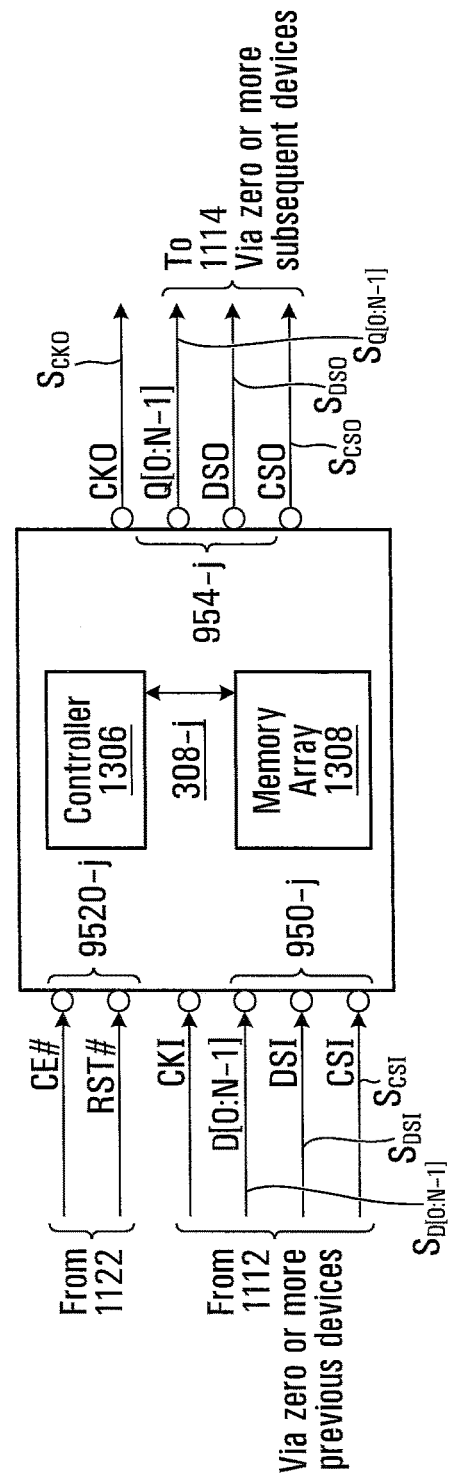

MASS DATA STORAGE SYSTEM WITH NON-VOLATILE MEMORY MODULES

BACKGROUND

Today's computing devices generally use multiple types of memory systems. One type of memory system is so-called "main memory", which comprises semiconductor memory devices that can be randomly written to and read from with very fast access times. As such, main memory is commonly referred to as random access memory (RAM).

Since semiconductor memory devices are relatively expensive, other higher density and lower cost memory systems are often used to complement main memory. One such example is a magnetic disk storage system (also called a "hard disk"). Magnetic disk storage systems are used for storing large quantities of data which can then be sequentially read into main memory as needed. However, while data can be stored more cheaply in a hard disk than in RAM, access times are longer, being generally on the order of tens of milliseconds for a hard disk compared to only hundreds of nanoseconds for RAM.

Yet another type of memory system is a so-called solid state disk (also called "solid state drive", or "SSD"). An SSD is a data storage device that uses memory chips to store data, instead of the spinning platters found in conventional hard disks. SSDs are quite versatile and in fact the term "SSD" can be used to refer to two different kinds of products.

The first type of SSD is based on fast, volatile memory such as, for example, Synchronous Dynamic Random Access Memory (SDRAM), and thus is categorized by very fast data access times. Since such an SSD uses volatile memory, it typically incorporates internal battery and backup disk systems to ensure data persistence. Thus, if power is lost for whatever reason, the battery keeps the unit powered long enough to copy all data from SDRAM to a backup hard disk. Upon the restoration of power, data is copied back from the backup hard disk to SDRAM and the SSD resumes normal operation. This type of SSD is especially useful in accelerating applications that would otherwise be held back by the inherent latency of disk drives.

The second type of SSD uses non-volatile memory, such as, for example, Flash Electrically Erasable Programmable Read Only memory (EEPROM), to store data. Products incorporating this second type of SSD can have the same form factor as conventional mass storage products, and are typically used as low power, rugged replacements for hard disks. To avoid confusion with SSDs of the first type, SSDs of the second type are generally referred to as "Flash" SSDs. The remainder of the present disclosure is directed to Flash SSDs.

A conventional Flash SSD can consist of several non-volatile NAND-type Flash EEPROM semiconductor integrated circuits with a form factor corresponding to a 3.5", 2.5" or 1.8" hard disk drive (HDD). The Flash SSD is connected to a host controller through conventional PATA or SATA interfaces, as with the HDD it was designed to replace. Therefore, Flash SSDs are limited by the available number of PATA or SATA connectors inside the computing device. As a result, the memory capacity provided by conventional Flash SSDs may be inadequate to meet the ever growing need for mass data storage brought on by current and future computing applications.

Against this background, there is clearly a need in the industry for an improved mass data storage system that uses non-volatile memory.

SUMMARY

According to a first aspect, there is provided a mass data storage system, which comprises: a controller for issuing and receiving signals to carry out memory operations; a motherboard comprising at least one first connector and providing signal pathways for establish a ring from the controller via each of the at least one first connector and back to the controller; and at least one non-volatile memory module comprising a second connector electrically connected to a chain of non-volatile memory devices, wherein mating of the second connector with a given one of the at least one first connector causes the chain of non-volatile memory devices to be inserted into the ring, thereby to allow the controller to carry out the memory operations on the non-volatile memory devices in the chain.

According to a further aspect, there is provided a non-volatile memory module, which comprises: a chain of non-volatile memory devices; a plurality of electrical conductors for carrying input signals received at the module to the chain and for carrying output signals to be released from the module, at least some of the output signals being versions of corresponding ones of the input signals that have been propagated by the chain; and a dual-faced connector providing an external interface for the electrical conductors, the connector being configured to releasably mate with a corresponding connector of a motherboard providing electrical contact with a controller for carrying out memory operations on the non-volatile memory devices in the chain; wherein the electrical conductors carrying the input signals are disposed on a first face of the connector and wherein the electrical conductors carrying the output signals are disposed on a second, opposite face of the connector in respective alignment with the electrical conductors carrying the input signals.

According to another aspect, there is provided a computing device, which comprises: an input/output interface; a main memory storing instructions; at least one processor for executing computing operations based on instructions stored in the main memory; and a mass data storage system electrically connected to the at least one processor. The mass data storage system comprises: a controller for carrying out memory operations based on signals received from the at least one processor; a motherboard comprising at least one first connector and providing signal pathways for establish a ring from the controller via each of the at least one first connector and back to the controller; and at least one non-volatile memory module comprising a second connector electrically connected to a chain of non-volatile memory devices, wherein mating of the second connector with a given one of the at least one first connector causes the chain of non-volatile memory devices to be inserted into the ring, thereby to allow the controller to carry out the memory operations on the non-volatile memory devices in the chain.

According to yet another aspect, there is provided a server, which comprises: a network interface to enable communication with at least one client over a network; a processing portion capable of executing at least one application and servicing requests received from said at least one client; and a mass data storage system electrically connected to the processing portion. The mass data storage system comprises: a controller for carrying out memory operations based on signals received from the processing portion; a motherboard comprising at least one first connector and providing signal pathways for establish a ring from the controller via each of the at least one first connector and back to the controller; and at least one non-volatile memory module comprising a second connector electrically connected to a chain of non-volatile memory devices, wherein mating of the second connector with a given one of the at least one first connector causes the chain of non-volatile memory devices to be inserted into the ring, thereby to allow the controller to carry out the memory operations on the non-volatile memory devices in the chain.

BRIEF DESCRIPTION OF THE DRAWINGS

FIG. 13 is a block diagram of a first type of non-volatile memory device that can be employed with embodiments of the present invention;

FIG. 14 is a block diagram of a first type of non-volatile memory device that can be employed with embodiments of the present invention;

DETAILED DESCRIPTION

Mass data storage systems based on embodiments of the present invention can be incorporated into numerous types of computing devices, including desktop computers, laptops, tablet PCs, servers (including web servers and mainframes) and mobile electronic communication devices, to name a few non-limiting possibilities.

Figure 1:
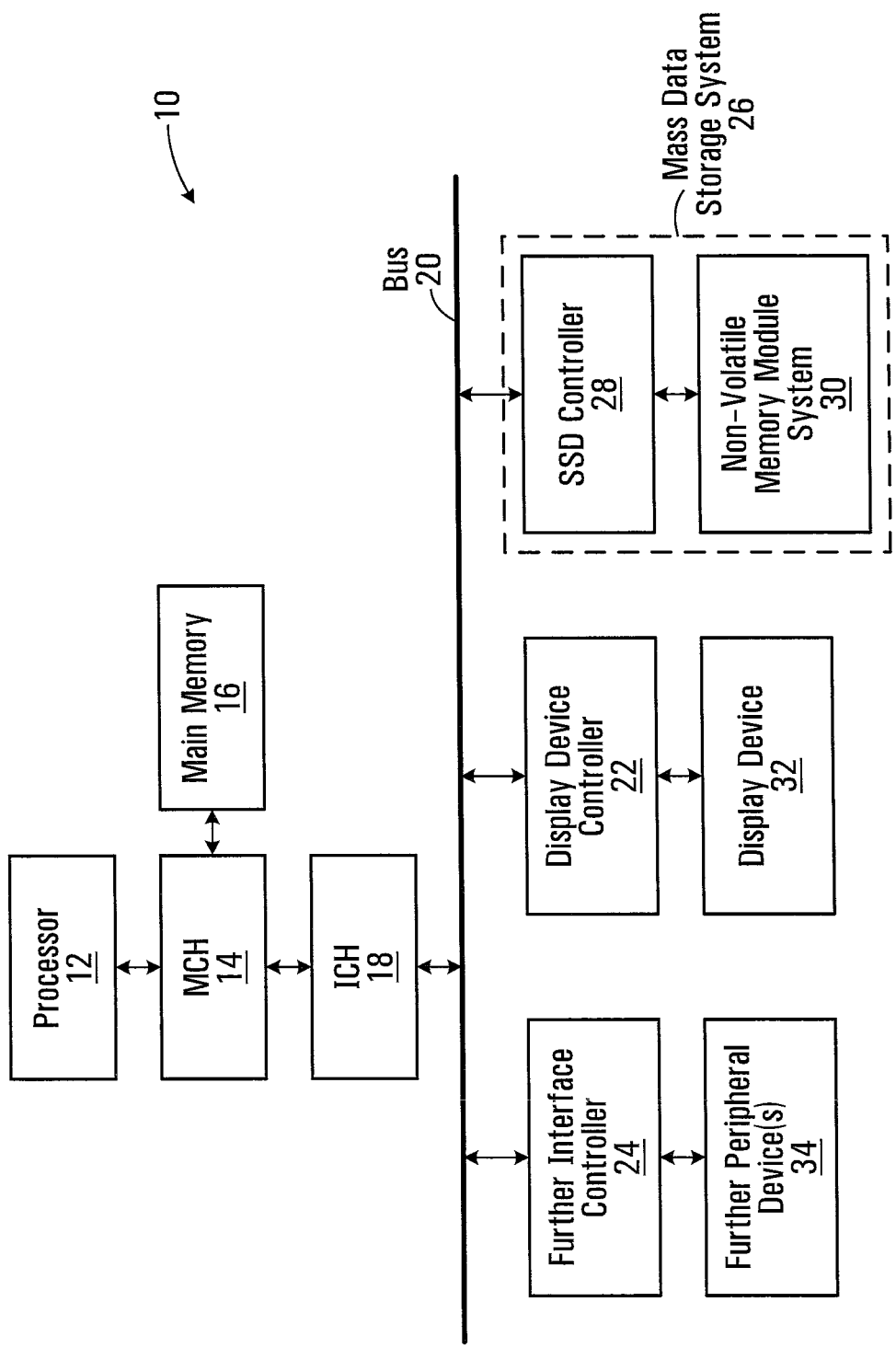
FIG. 1 is a block diagram of a computing device equipped with a mass data storage system, in accordance with a specific non-limiting embodiment of the present invention.

In particular, reference is made to FIG. 1, which shows a computing device 10 such as, for example, a laptop or tablet PC. The portable computing device 10 includes a processor 12 that processes data signals. The processor 12 may be a complex instruction set computer (CISC) microprocessor, a reduced instruction set computing (RISC) microprocessor, a very long instruction word (VLIW) microprocessor, a processor implementing a combination of instruction sets, or other processor device. The processor 12 can be a single-core or multi-core processor. Also, not excluded is the possibility of there being multiple processors, similar to the processor 12, in the portable computing device 10.

The processor 12 is electrically connected to a memory controller hub (MCH) 14, which interfaces to a main memory 16. The main memory 16 may be a dynamic random access memory (DRAM) device, a synchronous dynamic random access memory (SDRAM) device, or other high speed volatile memory device. The main memory 16 may store instructions and code that are executable by the processor 12.

The MCH 14 also interfaces to an I/O controller hub (ICH) 18, which is electrically connected to a bus 20 that transmits data signals between the I/O controller hub (ICH) 18 and other components electrically connected to the bus 20. The bus 20 may be a single bus or a combination of multiple buses. As an example, the bus 20 may comprise a Peripheral Component Interconnect (PCI) bus, a PCI-Express bus, a Serial ATA bus, a Personal Computer Memory Card International Association (PCMCIA) bus, other buses or combinations thereof.

The bus 20 provides communication links among components in the portable computing device 10. Specifically, a display device controller 22 is electrically connected to the bus 20. The display device controller 22 permits use of a display device 32 and acts as an interface between the display device 32 (or a frame buffer thereof) and a remainder of the portable computing device 10. The display device controller 22 may be a monochrome display adapter (MDA) card, a color graphics adapter (CGA) card, an enhanced graphics adapter (EGA) card, an extended graphics array (XGA) card or other display device controller. The display device 32 may be integrated to the portable computing device 10 but it may also be an external device such as, for example, a television set, a computer monitor, a flat-panel display or other suitable display device coupled to the portable computing device 10 via a port or cable. The display device 32 receives data signals from the processor 12 through the display device controller 22 and converts the data signals into a visual output presented to the user of the portable computing device 10.

In addition, a further interface controller 24 is electrically connected to the bus 20. The further interface controller 24 is electrically connected to one or more further peripheral device(s) 34 such as, for example, a keyboard, mouse, network device or audio device.

In addition, a mass data storage system 26 is electrically connected to the bus 20. The mass data storage system 26 comprises a solid state drive (SSD) controller 28 and a non-volatile memory module system 30 as will be described in further detail herein below. The mass storage system 26 stores large quantities of data that may be accessed by the processor 12.

Figure 2:
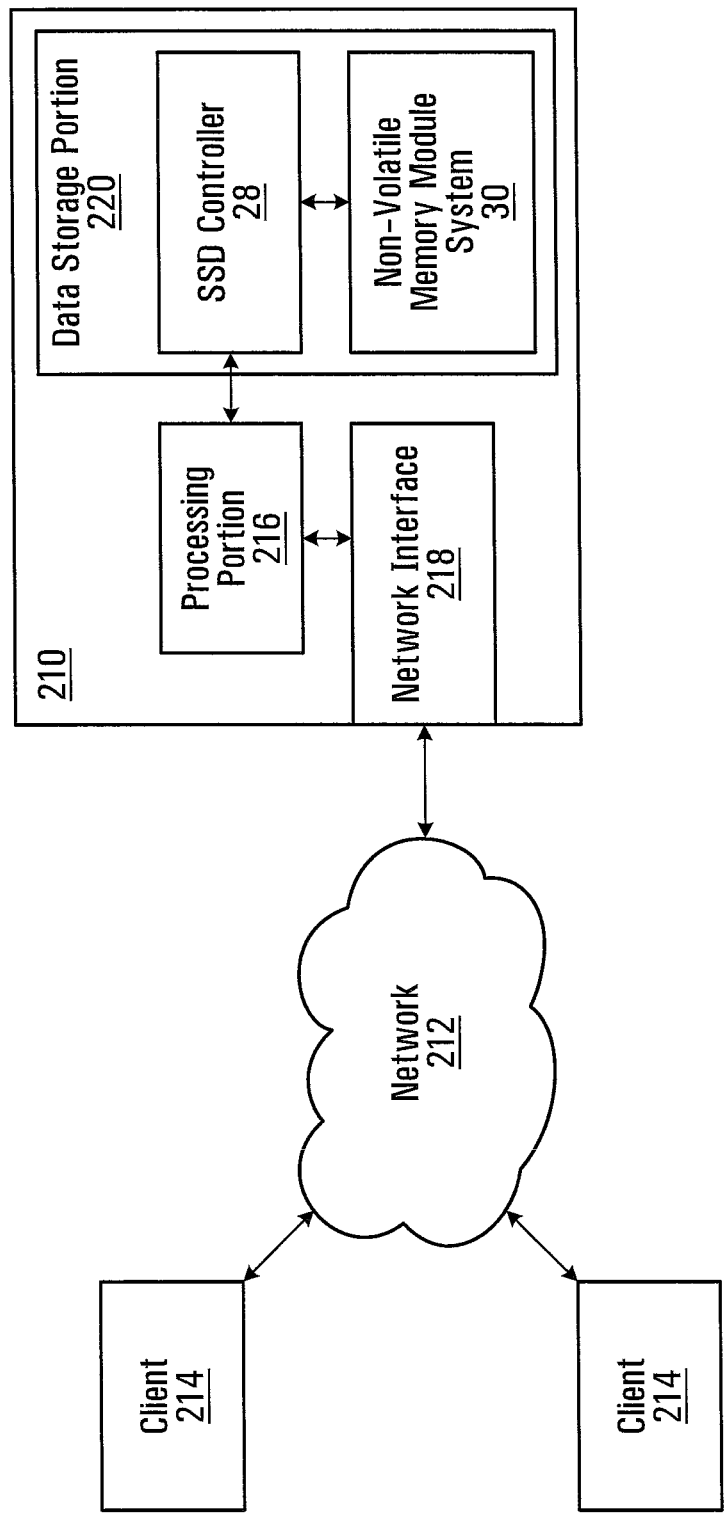
FIG. 2 is a block diagram of a server equipped with a mass data storage system, in accordance with a specific non-limiting embodiment of the present invention.

Reference is now made to FIG. 2, which shows a server 210 such as a web server or mainframe, to name two non-limiting possibilities. The server 210 is reachable over a network 212 by one or more clients 214. The network 212 can be the Internet, a local area network (LAN), a wireless network, or any other conceivable network or combination of networks. The server 210 includes a network interface 218, a processing portion 216 and a data storage portion 220.

The network interface 218 allows the one or more clients 214 to access the server 210 over the network 212. The illustrated network interface 218 is shown within the server 210; in alternative examples, however, the network interface 218 may be implemented as a separate device or internal to a system in communication with the server 210.

The processing portion 216 includes one or more processors (not shown) and a main memory system (not shown). The processing portion 216 services requests from the one or more clients 214 in the course of executing one or more applications such as, for example, a search engine, a hosted data processing application, an e-commerce application, a reservation/booking application, and so on.

The data storage portion 220 can be integrated with the processing portion 216. Alternatively, the data storage portion 220 can be electrically connected to the processing portion 216 via a data link or a network. In a non-limiting example embodiment, the data storage portion 220 may comprise a storage area network (SAN). The data storage portion 220 can be a mass data storage system that comprises the aforementioned SSD controller 28 and non-volatile memory module system 30 to be described in further detail herein below. The mass data storage system is capable of storing large quantities of data that may be accessed by the processing portion 216 and/or by the one or more clients 214.

Figure 3:
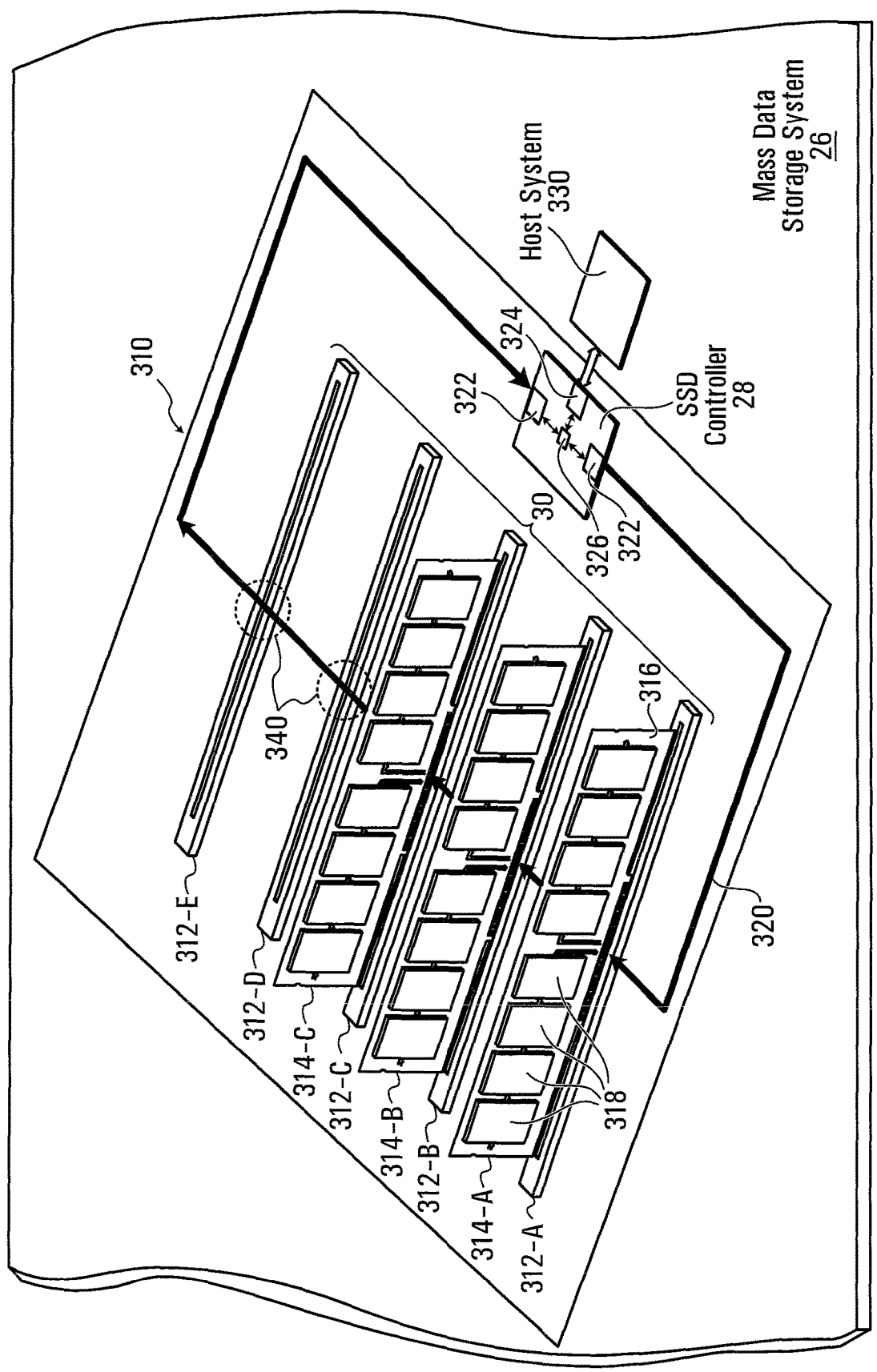
FIG. 3 is a perspective view of a mass data storage system in accordance with a specific non-limiting embodiment of the present invention, including a controller, a plurality of socket connectors and a plurality of non-volatile memory modules for insertion into the socket connectors.
Figure 4:
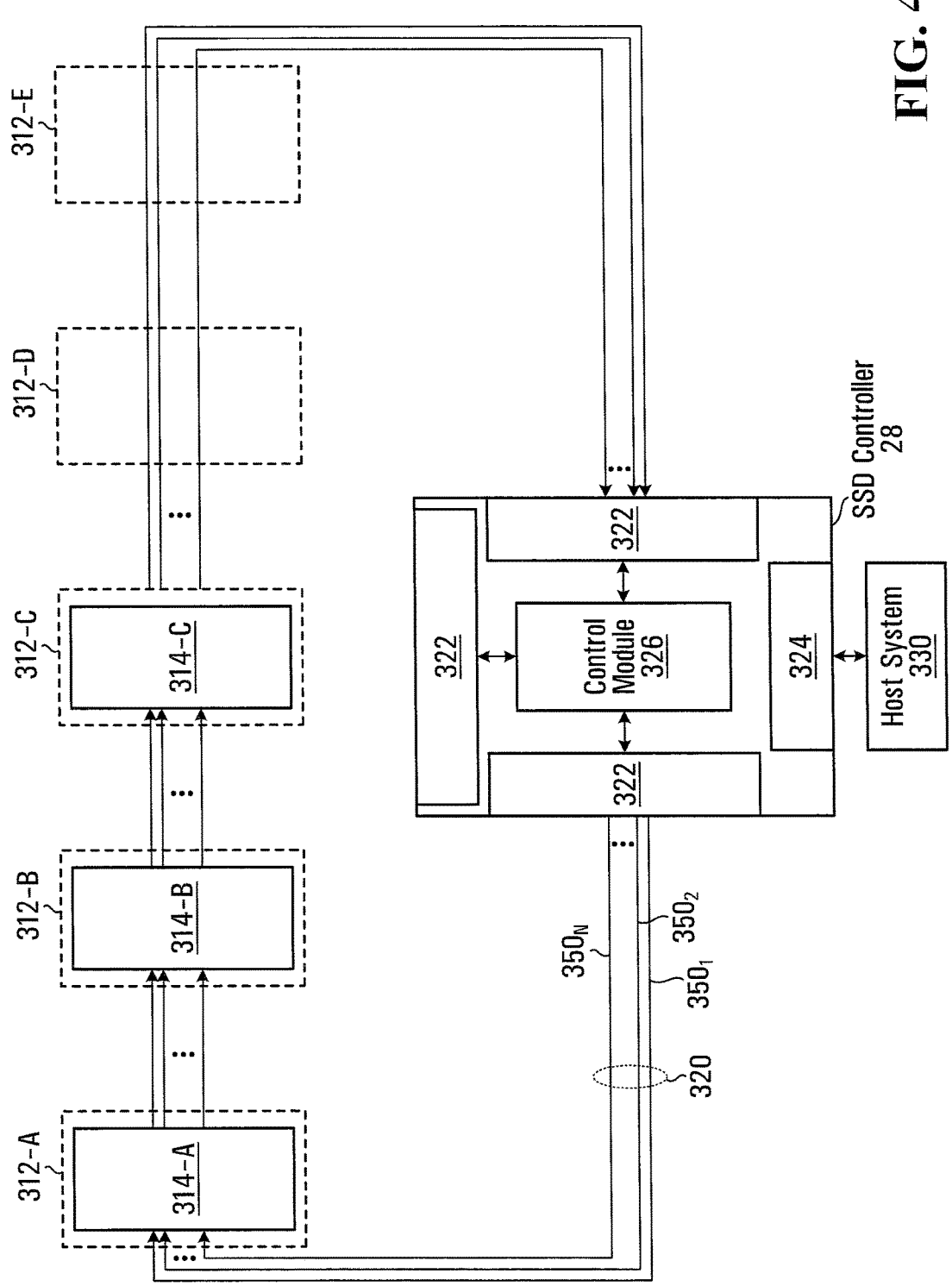
FIG. 4 is a block diagram of the mass data storage system in FIG. 3.

Reference is now made to FIGS. 3 and 4, which shows a mass storage system including the aforementioned SSD controller 28 and non-volatile memory module system 30. The non-volatile memory module system 30 includes one or more socket connectors 312-A, 312-B, 312-C, 312-D, 312-E and one or more non-volatile memory modules 314-A, 314-B, 314-C. The socket connectors 312-A, 312-B, 312-C, 312-D, 312-E are physical connectors that are mounted on a motherboard 310 and arranged in a ring 320. The ring 320 forms a closed electrical circuit from, and back to, the SSD controller 28. It should be appreciated that the ring 320 include a plurality individually insulated signal pathways $350_1, 350_2, \ldots, 350_N$ travelling in parallel, as seen in FIG. 4. The significance of the various signal pathways $350_1, 350_2, \ldots, 350_N$ depends on the architecture of the SSD controller 28 and the non-volatile memory module system 30.

In the illustrated embodiment, five (5) socket connectors 312-A, 312-B, 312-C, 312-D, 312-E are shown, although it should be appreciated that the present invention is not limited to any particular number of socket connectors. Supported in three of the socket connectors 312-A, 312-B, 312-C are corresponding non-volatile memory modules 314-A, 314-B, 314-C. The other two (2) socket connectors 312-D and 312-E are shown as not supporting a respective memory module, i.e., they are "empty". Nevertheless, the ring 320 is represented as traversing the empty sockets 312-D, 312-E in FIGS. 3 and 4 (see, in particular, regions marked 340 in FIG. 3) because electrical continuity is provided due to a special socket connector design, which will be described in greater detail later on in this specification. Of course, it should be understood that this socket occupancy arrangement is merely for illustrative purposes and that other arrangements are possible.

Non-volatile memory module 314-A comprises a printed circuit board (PCB) 316 with a chain of non-volatile memory devices 318 mounted thereon. The PCB 316 operates as a "daughter card" which can be releasably mated with any one of the socket connectors 312-A, 312-B, 312-C, 312-D, 312-E of the motherboard 310. A similar description applies to non-volatile memory modules 314-B and 314-C.

The SSD controller 28 includes a physical interface 322, a host interface 324 and a control module 326. The physical interface 322 enables the SSD controller 28 to communicate with the non-volatile memory devices 318 of the non-volatile memory modules 314-A, 314-B, 314-C via the ring 320 and it also enables the non-volatile memory devices 318 of the non-volatile memory modules 314-A, 314-B, 314-C to communicate with the SSD controller 28 via the ring 320. The host interface 324 enables the SSD controller 28 to communicate with a host system 330 and it also enables the host system 330 to communicate with the SSD controller 28. In the embodiment of FIG. 1, the host system 330 could include the processor 12 of the portable computing device 10 communicating via the MCH 14, the ICH 18 and the bus 20, while in the embodiment of FIG. 2, the host system 330 could include the processing portion 216 of the server 210.

The illustrated host interface 324 is shown within the SSD controller 28; however in alternative examples the host interface 324 may be implemented as a separate device, or it may be internal to a system that is in communication with the SSD controller 28. Also, although the SSD controller 28 has been illustrated as a separate component mounted on the motherboard 310, those skilled in the art will appreciate that the SSD controller 28 may be mounted off the motherboard, such as, for example, embedded in the host system 330.

The control module 326 includes a file/memory management submodule (not shown). Among other possible functions, the file/memory management submodule provides a mapping of logical addresses to physical addresses, so that physical addresses of requested data can be determined. In order to establish this mapping, the file/memory management submodule may execute algorithms that distribute and/or redistribute data stored by the non-volatile memory devices 318 on the non-volatile memory modules 314-A, 314-B, 314-C in order to perform so-called "wear-leveling" and/or in order to ensure that physical addresses corresponding to "bad" memory cells are not made available to or used by the host system 330. This latter mapping aspect is commonly referred to as "mapping out", which in the context of example embodiments is not limited to bad memory cells being mapped out.

In at least some examples of the SSD controller 28, the control module 326 may include the following submodules, at least some of which will be seen to be components of the file/memory management submodule: an allocator, a cleaner and a static wear-leveler. The allocator handles translation of logical addresses to physical addresses in accordance with any one of known translation mechanisms that are understood by those skilled in the art, such as, for example, NAND Flash Translation Layer (NFTL). With respect to the cleaner, it handles garbage collection to reclaim pages of invalid data in a manner understood by those skilled in the art. With respect to the static wear-leveler, it handles wear-leveling, which is characterized by data redistribution carried out in a manner consistent with the goal of evenly distributing the number of erasures for each block of memory. Wear-leveling is necessary due to Flash memory device's inherent limitation on the number of erasures of an individual block of memory. The motivation of static wear-leveling is to prevent any "cold" data (as contrasted with "hot" data) from staying at any block for too long a period. This can be achieved by minimizing the maximum erase-count difference of any two blocks so that the lifetime of Flash memory may be extended.

Figure 5:
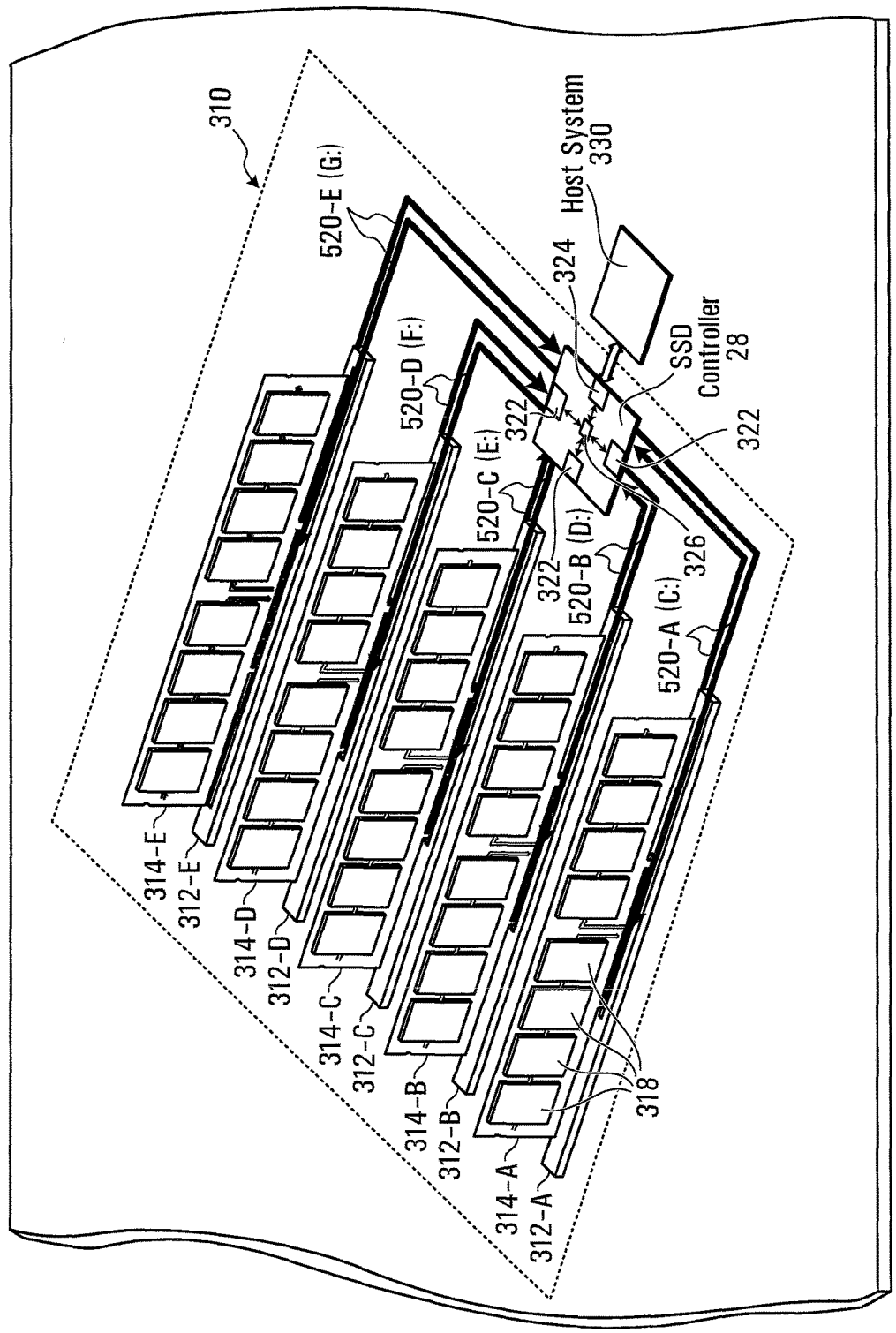
FIG. 5 is a perspective view of a mass data storage system in accordance with another specific non-limiting embodiment of the present invention.
Figure 6:
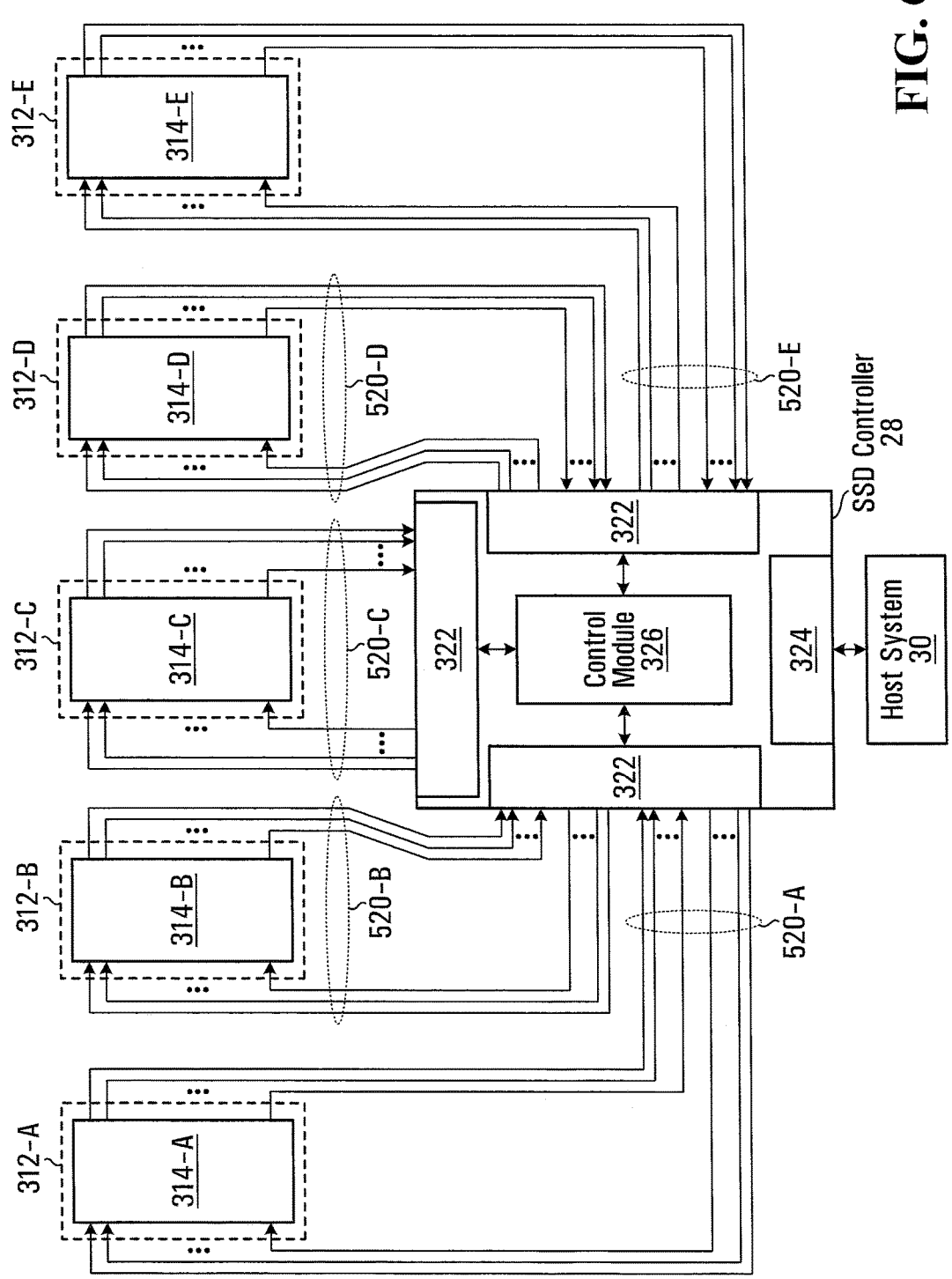
FIG. 6 is a block diagram of the mass data storage system in FIG. 5.

Those skilled in the art will appreciate that the mass storage system in FIGS. 3 and 4 may be adapted to provide not just one, but a plurality of rings forming respective closed electrical circuits from, and back to, the SSD controller 28. For example, in FIGS. 5 and 6, five (5) rings 520-A, 520-B, 520-C, 520-D and 520-E are provided, each of which includes one respective socket connector 312-A, 312-B, 312-C, 312-D, 312-E into which are inserted respective non-volatile memory modules 314-A, 314-B, 314-C, 314-D, 314-E. This allows the non-volatile memory modules 314-A, 314-B, 314-C, 314-D, 314-E to carry out processing in parallel instead of in series as would be the case with the single ring 320 of the embodiment of FIGS. 3 and 4. Of course, it should be understood that a mass storage system in accordance with an embodiment of the present invention is not limited to a particular number of rings or a particular number of memory modules per ring or a particular total number of memory modules.

It is noted that each of the rings 520-A, 520-B, 520-C, 520-D, 520-E may, in some examples, be assigned a unique drive letter (in this case, "C:", "D:", "E:", "F:" and "G:", respectively) that is recorded in the SSD controller 28. More specifically, it should be appreciated that a particular logical address is used by the aforementioned file/memory management submodule to represent a specific memory location on a specific one of the non-volatile memory devices on a specific one of the non-volatile memory modules in a given ring. To distinguish among different rings, the particular logical address can include one of the aforementioned drive letters. Thus, to take the above example of drive letter assignments, if the host system 330 specifies that it needs to access logical address XYZ on drive "F:", then the file/memory management submodule knows to translate logical address XYZ into a physical address within the existing memory module architecture on ring 520-D and not any of the other rings.

Figure 8:
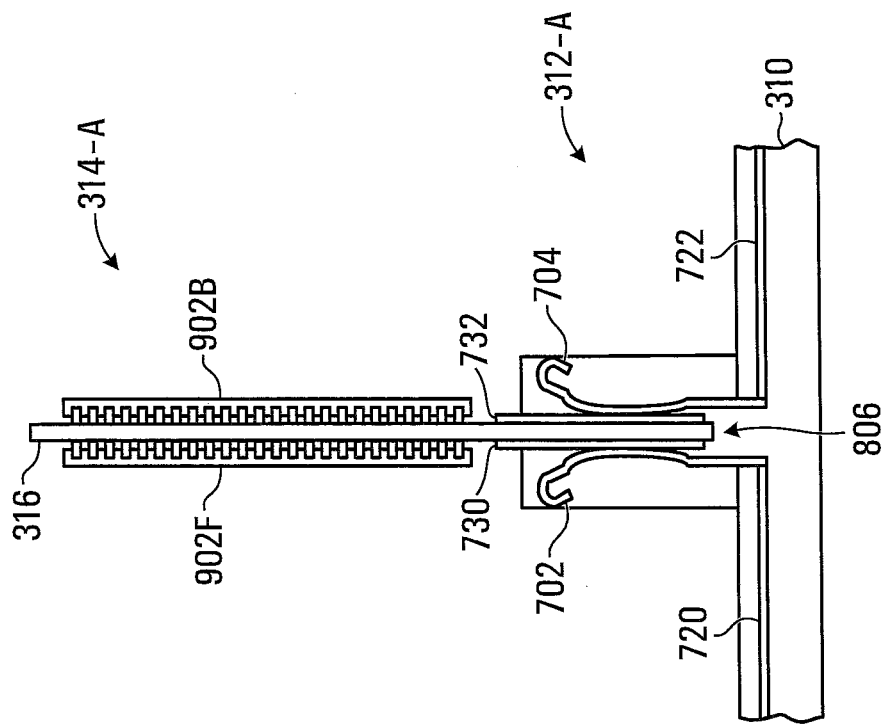
FIG. 8 is a cross-sectional view of a socket connector that accommodates an inserted non-volatile memory module, in accordance with a specific non-limiting embodiment of the present invention.
Figure 7:
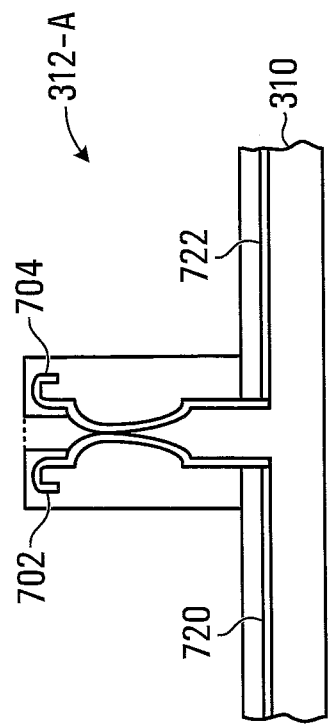
FIG. 7 is a cross-sectional view of an empty socket connector, in accordance with a specific non-limiting embodiment of the present invention.

With reference now to FIGS. 7 and 8, a cross-sectional view of socket connector 312-A is shown in elevation. Although socket connector 312-A is used as an example, it will be appreciated that the description to follow also applies to the other socket connectors 312-B, 312-C, 312-D, 312-E. Socket connector 312-A can acquire either of two states. In the first state, which is shown in FIG. 7, socket connector 312-A is empty, while in the second state, which is shown in FIG. 8, socket connector 312-A is in use. Specifically, when socket connector 312-A is in use, then a particular one of the memory modules, in this case non-volatile memory module 314-A, will be inserted (plugged) into socket connector 312-A.

As mentioned above, socket connector 312-A has a special construction that allows electrical continuity to be maintained even if it is empty. To this end, socket connector 312-A includes a plurality of first electrical conductors or "pins" (of which only pin 702 is shown in FIGS. 7 and 8) and a plurality of second pins (of which only pin 704 is shown in FIGS. 7 and 8). The second pins correspond respectively to the first pins. Considering now two such corresponding pins, namely pins 702 and 704, these are made of an electrically conductive and elastic material such as, for example, a thin metallic plate. Pins 702 and 704 are in electrical contact with respective signal traces 720, 722 in the motherboard 310. Signal trace 720 is an example of an individually insulated signal that forms a section of the ring 320 between socket connector 312-A and the SSD controller 28. Similarly, signal trace 722 is an example of an individually insulated signal that forms another section of the ring 320 between socket connector 312-A and socket connector 312-B.

When the socket connector 312-A is empty, as in FIG. 7, pins 702 and 704 are brought into contact with each other by mechanical spring action of the thin metallic plates. In this way, electrical contact between the two signal traces 720, 722 in the motherboard 310 is achieved. This effect is similarly achieved for the other signal traces (not shown) leading to and from socket connector 312-A. Overall, this allows the ring 320 that passes through socket connector 312-A to maintain electrically continuity even when socket connector 312-A is empty.

In addition, as shown in FIG. 8, pins 702 and 704 are capable of being physically separated by wedging a non-volatile memory module (in this case, non-volatile memory device 314-A) therebetween. To facilitate this operation, pins 702 and 704 can be curved outwardly with inwardly facing bulges that maintain electrical contact with each other when socket connector 312-A is empty and are physically separated when non-volatile memory module 314-A is inserted therein.

When non-volatile memory module 314-A is indeed wedged in between pins 702 and 704, as in FIG. 8, pin 702 is brought into contact with a corresponding input pin 730 on a front face 902F of non-volatile memory module 314-A, while pin 704 is brought into contact with a corresponding output pin 732 on a back face 902B of non-volatile memory module 314-A. This effect is similarly achieved for the pairs of corresponding first and second pins of socket connector 312-A. Thus, when socket connector 312-A is in use, electrical signals traveling on the ring 320 will be forced to pass through the circuitry of non-volatile memory module 314-A.

It should thus be appreciated that the use of socket connectors of the type shown in FIGS. 7 and 8 allows the formation of a ring (such as ring 320) starting from the SSD controller 28 via one or more socket connectors (such as socket connectors 312-A, 312-B, 312-C, 312-D, 312-E) and back to the SSD controller 28, without regard as to whether or not any non-volatile memory modules (such as non-volatile memory modules 314-A, 314-B, 314-C, 314-D, 314-E) are plugged into any of the socket connectors.

In some examples, non-volatile memory module 314-A can have a standard 5.25 inch length and a 1 to 1.5 inch width so that it can accommodate approximately 4 to 8 chip packages on each of its two faces 902F, 902B. Other configurations are of course possible. Non-volatile memory module 314-A can be referred to as an "in-line" memory module when it consists of parts arranged in a single line. Moreover, when non-volatile memory module 314-A includes Flash memory, one can refer to it as a Flash In-line Memory Module ("FIMM").

Figure 10:
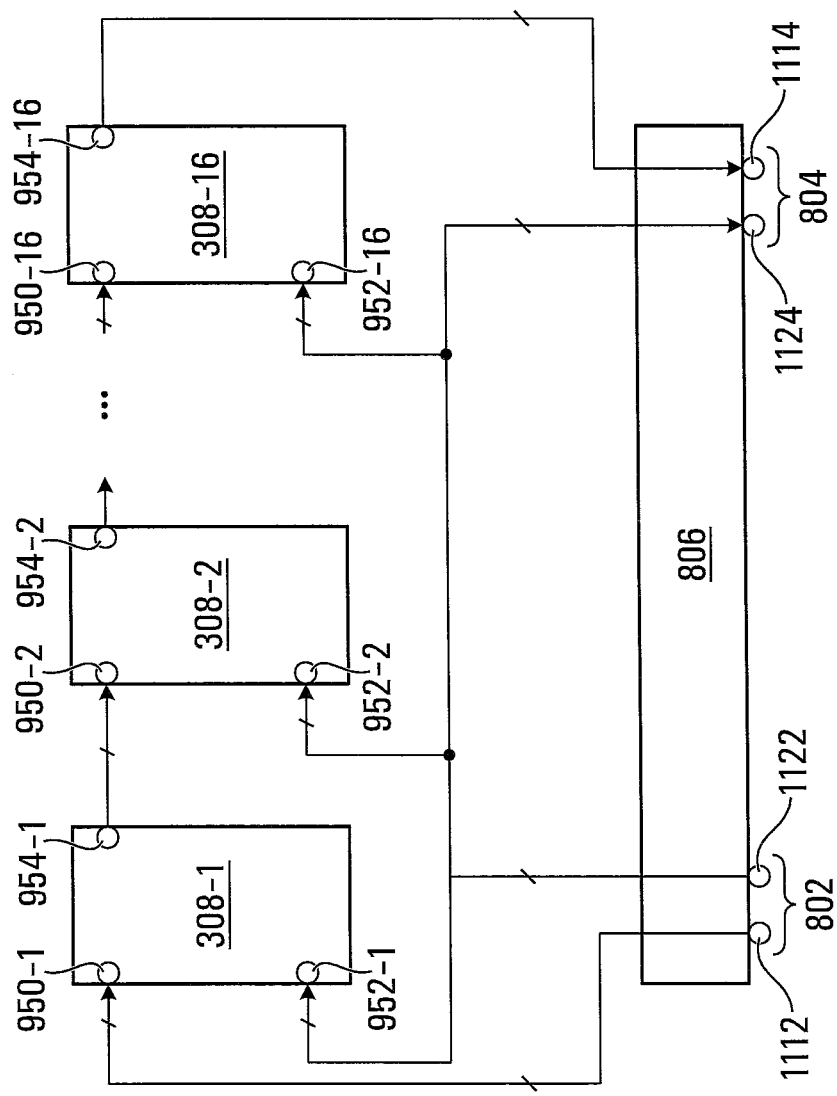
FIG. 10 is a block diagram of the non-volatile memory devices of FIGS. 7 and 8.

With continued reference to FIG. 8 and with additional reference to the functional block diagram in FIG. 10, non-volatile memory module 314-A is provided with a dual-faced connector 806. The connector 806 is a physical connector which, when combined with a socket connector into which it is mated, provides rigid support for non-volatile memory module 314-A. The connector 806 provides an external interface for a set of input pins 802 (which includes aforementioned input pin 730) and a set of output pins 804 (which includes aforementioned output pin 732). The input pins in the set of input pins 802 can be disposed on the front face 902F of non-volatile memory device 314-A, while the output pins in the set of output pins 804 may be disposed on the back face 902B of non-volatile memory device 314-A.

The input pins 802 and the output pins 804 respectively correspond to one another. This can mean that each of the input pins 802 corresponds with a particular one of the output pins 804. Moreover, corresponding ones of the input pins 802 and the output pins 804 may be aligned on either face of non-volatile memory module 314-A. To elaborate, consider the case of an x-y-z coordinate system where the front face 902F and the back face 902B of non-volatile memory module 314-A define respective x-y planes, and where the z coordinate therefore refers to a depth within the PCB 316. By two corresponding pins being "aligned", this can mean that they occupy the same x and y coordinates, but different z coordinates. Of course, complete alignment may not be required, since for example it may be sufficient for only a subset of the x and y coordinates occupied by two corresponding pins to be the same. Other suitable arrangements within the knowledge of those skilled in the art are also contemplated. It should also be appreciated that changes in what constitutes "alignment" between two corresponding pins of non-volatile memory module 304-A may require changes in the design of the socket connectors, so as to maintain electrically continuity of ring 302 even when the socket connectors are empty.

When non-volatile memory module 314-A is mated with socket connector 312-A (e.g., by insertion), the input pins 802 establish electrical contact with respective pins (including pin 702) on one side of socket connector 312-A. Similarly, the output pins 804 establish electrical contact with respective pins (including pin 704) on the other side of socket connector 312-A. In particular, as shown in FIG. 8, input pin 730 and output pin 732 establish electrical contact with, respectively, pins 702 and 704 belonging to socket connector 312-A. Thus, when socket connector 312-A is in use, electrical signals traveling on the ring 320 will be forced to pass through the circuitry of non-volatile memory module 314-A.

As stated earlier, and with reference to FIG. 10, the circuitry of non-volatile memory module 314-A includes a chain of non-volatile memory devices 318. In the illustrated embodiment, there are sixteen (16) non-volatile memory devices in the chain, denoted 308-1 to 308-16 and respectively ordered from first to last (i.e., sixteenth). However, the present invention does not impose any particular limitation on the number of non-volatile memory devices that can be mounted and interconnected on a particular non-volatile memory module.

From a functional point of view, the set of input pins 802 diagrammatically shown in the specific, non-limiting embodiment of FIG. 10 can be subdivided into a first subset of input pins 1112 carrying input signals through the PCB 316 (e.g., using vias or buried trace signals) for propagation by the non-volatile memory devices 308-1, . . . , 308-16, as well as a second subset of input pins 1122 carrying input signals through the PCB 316 for distribution among the non-volatile memory devices 308-1, . . . , 308-16 in a multi-drop fashion. The input pins in both the first subset of input pins 1112 and the second subset of input pins 1122 are accessible via the front face 902F of the PCB 316.

Still with reference to the specific, non-limiting embodiment of FIG. 10, the set of output pins 804 includes a first subset of output pins 1114 carrying output signals from the last non-volatile memory device 308-16 that correspond to respective ones of the input signals on respective ones of the input pins in the first subset of input pins 1112. The output pins in the first subset of output pins 1114 are aligned with the respective input pins in the first subset of input pins 1112. The set of output pins 804 also includes a second subset of output pins 1124 that are not only aligned with, but also are electrically connected to, respective ones of the input pins in the second subset of input pins 1122. The output pins in both the first subset of output pins 1114 and the second subset of output pins 1124 are accessible via the back face 902B of the PCB 316.

Looking now at the chain of non-volatile memory devices 308-1 to 308-16 of the embodiment of FIG. 10, the input pins in the first subset of input pins 1112 of the connector 806 (i.e., those carrying input signals that are to be propagated along the non-volatile memory devices in the chain) are electrically connected (e.g., using pathways through the PCB 316 of FIG. 3) to corresponding input pins in a first subset of input pins 950-1 of the first non-volatile memory device 308-1. In addition, the input pins in the second subset of input pins 1122 of the connector 806 (i.e., those carrying common input signals that are to be distributed to all the non-volatile memory devices in the chain) are electrically connected in parallel to (i) corresponding input pins in a second subset of input pins 952-1 of the first non-volatile memory device 308-1; (ii) corresponding input pins in similar subsets of input pins 952-2, . . . , 952-16 on each of the other non-volatile memory devices 308-2, . . . , 308-16; and (iii) corresponding output pins in the second set of output pins 1124 of the connector 806.

Still with reference to the specific, non-limiting embodiment of FIG. 10, the first non-volatile memory device 308-1 has a set of output pins 954-1 that carry output signals provided by the first non-volatile memory device 308-1. Some of these output signals are propagated versions of the input signals carried by the input pins in the first set of input pins 950-1. However, others of the output signals originate from the first non-volatile memory device 308-1 and are generated in response to stimuli received via the input pins in the first and second subsets of input pins 950-1, 952-1.

Still with reference to the first non-volatile memory device 308-1 of the illustrated embodiment, the output pins in the set of output pins 954-1 are electrically connected to corresponding input pins in a first subset of input pins 950-2 of the second non-volatile memory device 308-2. The second non-volatile memory device 308-2 similarly has a corresponding set of output pins 954-2 that are electrically connected to corresponding input pins (not shown) of the third non-volatile memory device 308-3, and so on, until the last non-volatile memory device 308-16 is reached via a first subset of its input pins 950-16. The last non-volatile memory device 308-16 has a set of output pins 954-16 respectively electrically connected to the first subset of output pins 1114 of the connector 806.

It should be noted that the specific functionality of the input pins and output pins of the non-volatile memory devices 308-1, . . . , 308-16 in the chain can vary from one embodiment to the next as a result of various device architectures that can be adopted without departing from the scope of the present invention.

For example, FIG. 13 is a block diagram of a first type of architecture for non-volatile memory device 308-$j$ that can be used in embodiments of the present invention. Further details regarding the structure and operation of non-volatile memory device 308-$j$ can be found in U.S. patent application Ser. No. 12/033,577 entitled "System Having One or More Memory Devices", published as United States Patent Application Publication 2008/0201548 on Aug. 21, 2008, hereby incorporated by reference herein.

Non-volatile memory device 308-$j$ includes a controller 1306, a memory array 1308, and an interface comprising a plurality of input pins and output pins. The controller 1306 performs various control and processing functions with access to the memory array 1308 in response to signals arriving via the input pins of the non-volatile memory device 308-$j$, and provides signals to a succeeding device via the output pins of the non-volatile memory device 308-$j$. The succeeding device relative to non-volatile memory device 308-$j$ is non-volatile memory device 308-($j$+1) or the SSD controller 28, depending on the relative position of non-volatile memory device 308-$j$ within the chain of non-volatile memory devices 318.

In particular, the interface of non-volatile memory device 308-$j$ includes one or more serial input pins (hereinafter, the "D[0:N−1] pins") and one or more serial output pins (hereinafter, the "Q[0:N−1] pins"). The D[0:N−1] pins, of which there can be 1, 2, 4, 8, or any other number, are used to transfer information (e.g., address, command and data information), among others, carried by an input information signal $S_{D[0:N-1]}$ into non-volatile memory device 308-$j$, some of this information being destined for the controller 1306 and some being destined for the memory array 1308. The Q[0:N−1] pins, which number the same as the D[0:N−1] pins, provide an output information signal $S_{Q[0:N-1]}$ that carries information (e.g., address, command and data information) out of non-volatile memory device 308-$j$, with some of this information possibly having originated from the memory array 1308.

In addition, the interface of non-volatile memory device 308-$j$ includes a command strobe input pin (hereinafter, the "CSI pin") and a command strobe echo output pin (hereinafter, the "CSO pin"). The CSI pin receives a command strobe signal $S_{CSI}$. The command strobe signal $S_{CSI}$ is used by non-volatile memory device 308-$j$ to enable the D[0:N−1] pins such that when the command strobe signal $S_{CSI}$ is activated, it allows the serial input of data to non-volatile memory device 308-$j$ via the D[0:N−1] pins for processing by the controller 1306. The command strobe signal $S_{CSI}$ is also propagated through the controller 1306 to the CSO pin of non-volatile memory device 308-$j$ from which an echo signal $S_{CSO}$ is provided to the succeeding device.

In addition, the interface of non-volatile memory device 308-$j$ includes a data strobe input pin (hereinafter, the "DSI pin") and a data strobe echo output pin (hereinafter, the "DSO pin"). The DSI pin receives a data strobe signal $S_{DSI}$. The data strobe signal $S_{DSI}$ is used by non-volatile memory device 308-$j$ to enable the Q[0:N−1] pins such that when the data strobe signal $S_{DSI}$ is activated, this allows the serial output of data expected to be sent out by non-volatile memory device 308-$j$ via the Q[0:N−1] pins. The data strobe signal $S_{DSI}$ is also propagated through the controller 1306 to the DSO pin of non-volatile memory device 308-$j$ from which an echo signal $S_{DSO}$ is provided to the succeeding device, i.e., 308-($j$+1).

In addition, the interface of non-volatile memory device 308-$j$ includes a clock input pin (hereinafter, the "CK pin"). The CK pin receives an input clock signal $S_{CK}$ from the SSD controller 28, which is used to control latching of the signals present at the D[0:N−1] pins into registers (not shown) internal to non-volatile memory device 308-$j$, as well as latching of signals onto the Q[0:N−1] pins from registers internal to non-volatile memory device 308-$j$. The input clock signal $S_{CK}$ is also used to control latching of the signals present at the CSI and DSI pins into registers internal to non-volatile memory device 308-$j$ and subsequently onto the CSO and DSO pins, respectively.

In addition, the interface of non-volatile memory device 308-$j$ includes a chip select pin CE#, which receives a chip select signal from the SSD controller 28 that enables operation of non-volatile memory device 308-$j$ and other non-volatile memory devices concurrently. A reset pin RST# may also be provided, for the purposes of carrying a reset signal from the SSD controller 28 for resetting one or more functions of the non-volatile memory device 308-$j$.

In view of the above description, it will be apparent that the D[0:N−1], CSI and DSI pins belong to the first subset of input pins 950-$j$ of non-volatile memory device 308-$j$, which correspond to the input pins in the first subset of input pins 1112 of the connector 806 and are received via zero or more previous non-volatile memory devices. Also, it will be apparent that the CK, CE# and RST# pins belong to the second subset of input pins 952-$j$ of non-volatile memory device 308-$j$, which are electrically connected in parallel to the input pins in the second subset of input pins 1122 and also to the output pins in the second subset of output pins 1124 of the connector 806. (Power and ground pins also fall into this category, which are not illustrated for the sake of simplicity.) Finally, it will be apparent that the Q[0:N−1], CSO and DSO pins together form the set of output pins 954-$j$ of non-volatile memory device 308-$j$, which reach the output pins in the first set of output pins 1114 of the connector 806 via zero or more succeeding non-volatile memory devices.

Those skilled in the art will also appreciate that various additional components may be provided in non-volatile memory device 308-$j$ without departing from the scope of the invention, such as, for example, buffers, phase shifters, other logic sub-circuits, etc., depending on the clock rate type (e.g., single data rate versus double data rate), the clock response type (e.g., edge-aligned versus center-aligned) and various other aspects of the functionality of non-volatile memory device 308-$j$.

As mentioned above, the echo signals $S_{CSO}$ and $S_{DSO}$ are propagated versions of the command strobe signal $S_{CSI}$ and the data strobe signal $S_{DSI}$, respectively, and, as such, will have undergone a delay, referred to herein as an input-to-output latency (or "flow-through" latency) and denoted $T_{IOL-j}$. $T_{IOL-j}$, which can be expressed in terms of a number of clock cycles, characterizes the design of non-volatile memory device 308-$j$ and, more particularly, the controller 1306. $T_{IOL-j}$ may differ for devices of different types and specifications. In an embodiment, $T_{IOL-j}$ is designed to be as low as possible for a nominal clock rate, while guaranteeing that the controller 1306 has sufficient time to process information and data carried by the input information signal $S_{D[0:N-1]}$ at the D[0:N−1] pins and complete any requisite interactions with the memory array 1308.

Upon activation of the command strobe signal $S_{CSI}$, the data carried by the input information signal $S_{D[0:N-1]}$ is processed by non-volatile memory device 308-$j$ after a delay of $T_{IOL-j}$ clock cycles. Thus, one can view the state of the command strobe signal $S_{CSI}$ as establishing a time window during which the input information signal $S_{D[0:N-1]}$ carries data to be processed by non-volatile memory device 308-$j$. Meanwhile, the current states of the command strobe signal $S_{CSI}$, the data strobe signal $S_{DSI}$ and the input information signal $S_{D[0:N-1]}$ are transferred out onto the echo signal $S_{CSO}$, the echo signal $S_{DSO}$ and the output information signal $S_{Q[0:N-1]}$, respectively, so that they appear thereon after the aforesaid delay of $T_{IOL-j}$ clock cycles. Any relationship in terms of synchronization that may have existed among the input information signal $S_{D[0:N-1]}$, the command strobe signal $S_{CSI}$ and the data strobe signal $S_{DSI}$ is, therefore, maintained for the benefit of the succeeding device, i.e., 308-($j$+1).

The impact of activation of the data strobe signal $S_{DSI}$ is slightly different. On the one hand, non-volatile memory device 308-$j$ may expect to send out data based on a previously received instruction (e.g., a "read" command as will be described below). Here, activation of the data strobe signal $S_{DSI}$ causes such data to begin to appear in the output information signal $S_{Q[0:N-1]}$ after a delay of $T_{IOL-j}$ clock cycles. Meanwhile, the current states of the command strobe signal $S_{CSI}$ and the data strobe signal $S_{DSI}$ are transferred out onto the echo signals $S_{CSO}$ and $S_{DSO}$, respectively, so that they appear thereon after the aforesaid delay of $T_{IOL-j}$ clock cycles. Thus, where non-volatile memory device 308-$j$ expects to send out information, one can view the state of the echo signal $S_{DSO}$ as establishing a time window during which the output information signal $S_{Q[0:N-1]}$ validly carries data output by non-volatile memory device 308-$j$.

On the other hand, where non-volatile memory device 308-$j$ does not expect to send out information based on a previously received instruction (or in the absence of such instruction altogether), activation of the data strobe signal $S_{DSI}$ is meaningless for non-volatile memory device 308-$j$. In such cases, the current states of the command strobe signal $S_{CSI}$, the data strobe signal $S_{DSI}$ and the input information signal $S_{D[0:N-1]}$ are simply transferred out onto the echo signal $S_{CSO}$, the echo signal $S_{DSO}$ and the output information signal $S_{Q[0:N-1]}$, respectively, so that they appear thereon after the aforesaid delay of $T_{IOL-j}$ clock cycles. Any relationship in terms of synchronization that may have existed among the input information signal $S_{D[0:N-1]}$, the command strobe signal $S_{CSI}$ and the data strobe signal $S_{DSI}$ is, therefore, maintained for the benefit of the succeeding device.

Some of the data carried by the input information signal $S_{D[0:N-1]}$ during the above-mentioned time window (i.e., while the command strobe signal $S_{CSI}$ remains activated), may digitally encode a command from the SSD controller 28. Such commands are interpreted by the controller 1306 and translated into control signals fed to various elements of the memory array 1308 and other circuitry (not shown) of non-volatile memory device 308-$j$. Examples of a command include a "write" command and a read command, among other possibilities. In an embodiment of the present invention, commands are in the form of packets which form a higher layer protocol of communication between the SSD controller 28 and non-volatile memory device 308-$j$.

Reference is now made to FIG. 14, which is a block diagram of a second type of architecture for the non-volatile memory device 308-$j$ that can be used in embodiments of the present invention. As before, non-volatile memory device 308-$j$ includes the aforementioned CK pin for receiving the input clock signal $S_{CK}$, except that the input clock signal $S_{CK}$ is not received directly from the SSD controller 28 unless $j$=1. Additionally, non-volatile memory device 308-$j$ includes a clock output pin (hereinafter the "CKO pin") for supplying a processed version of the input clock signal (hereinafter the output clock signal $S_{CKO}$) to the succeeding device. In operation, the information carried by the output information signal $S_{Q[0:N-1]}$ is output in synchronism with the output clock signal $S_{CKO}$, based on the aforementioned data strobe signal $S_{DSI}$, which controls the "beginning" and the "end" of a window for valid output data.

In view of the above description, it will now be apparent that the D[0:N−1] pins, the CSI pin and the DSI pin, as well as the CK pin, belong to the first subset of input pins 950-$j$ of non-volatile memory device 308-$j$, which correspond to the input pins in the first subset of input pins 1112 of the connector 806 and are received via zero or more previous non-volatile memory devices. Meanwhile, it will be apparent that only the CE# pin and the RST# pin belong to the second subset of input pins 952-$j$ of non-volatile memory device 308-$j$, which are electrically connected in parallel to the input pins in the second subset of input pins 1122 and also to the output pins in the second subset of output pins 1124 of the connector 806. Finally, it will be apparent that the Q[0:N−1] pins, the CSO pin and the DSO pin, now joined by the CKO pin, together form the set of output pins 954-$j$ of non-volatile memory device 308-$j$, which reach the output pins in the first set of output pins 1114 of the connector 806 via zero or more succeeding non-volatile memory devices.

Moreover, it should be appreciated that non-volatile memory device 308-$j$ can provide SDR (Single Data Rate), DDR (Double Data Rate) or QDR (Quadruple Data Rate) operation in various non-limiting embodiments. This could make flow-through latency as small as a half clock cycle or a quarter clock cycle. In addition, non-volatile memory device 308-$j$ can be implemented using differential clock signals in order to achieve more accurate clock cycle timing in high-speed applications. In the same manner, the signals on the DSI pin, the CSI pin, the D[0:N−1] pins, the DSO pin, the CSO pin and the Q[0:N−1] pins can be differential signals if desired or beneficial.

Certain portions of the above description therefore refer to various architectures for non-volatile memory device 308-$j$ that can be used in embodiments of the present invention. It should be understood, however, that these embodiments are not limiting and, in particular, the types of non-volatile memory devices that can be used in embodiments of the present invention are in no way limited by the above described pin configuration and functionality. Indeed, other types of non-volatile memory devices may be suitable for providing point-to-point data flow, and such other types of non-volatile memory devices can be used without departing from the scope of the present invention. Specifically, a non-limiting alternative non-volatile memory device may lack one or more of the command strobe and data strobe pins (e.g., the CSI, CSO, DSI and DSO pins), while being equipped with other pins (carrying corresponding electrical signals) such as, for example, an address latch enable pin, an address latch enable echo pin, a command latch enable pin and a command latch enable echo pin, to name a few non-limiting possibilities. Other examples of additional pins that may be used in some embodiments include a read/write enable pin, a ready/busy pin and a write protect pin, each of which carries a corresponding electrical signal.

It should also be noted that there are various ways of physically arranging the connector 806 and the non-volatile memory devices 308-1, . . . , 308-16 on the PCB 316 of a given non-volatile memory module, as will now be discussed. Continued reference will be made to the higher-level block diagram of FIG. 10.

Figure 9A:
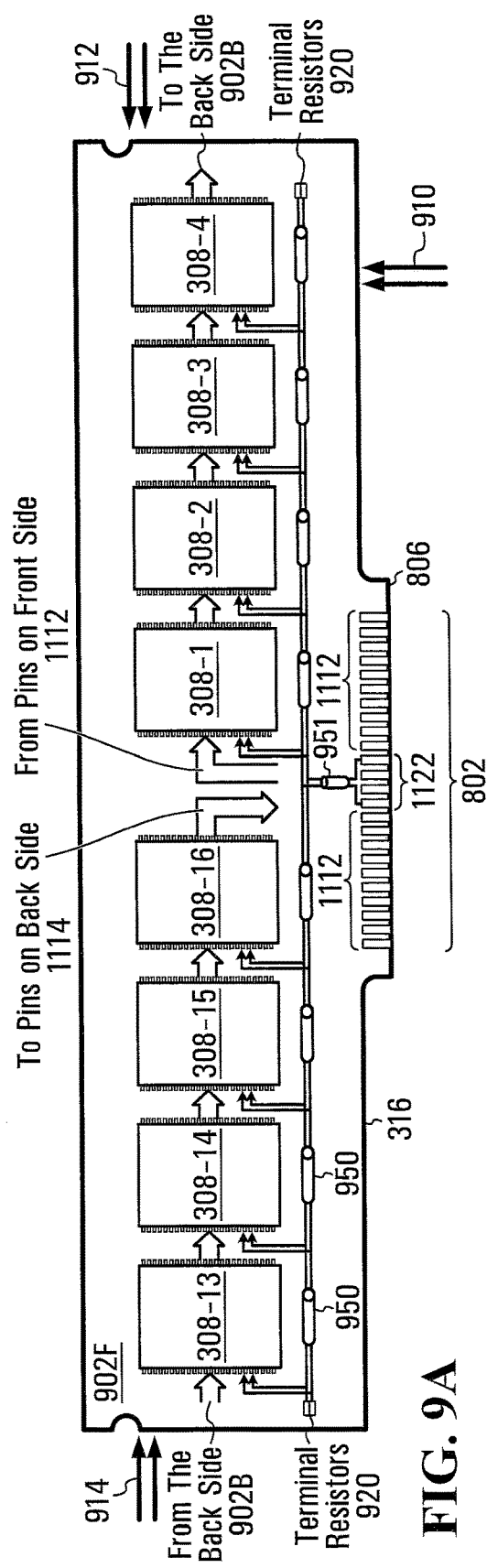
FIG. 9A illustrates a layout of non-volatile memory devices on a front face of a non-volatile memory module, in accordance with a specific non-limiting embodiment of the present invention in which a multi-drop clock is provided.
Figure 9B:
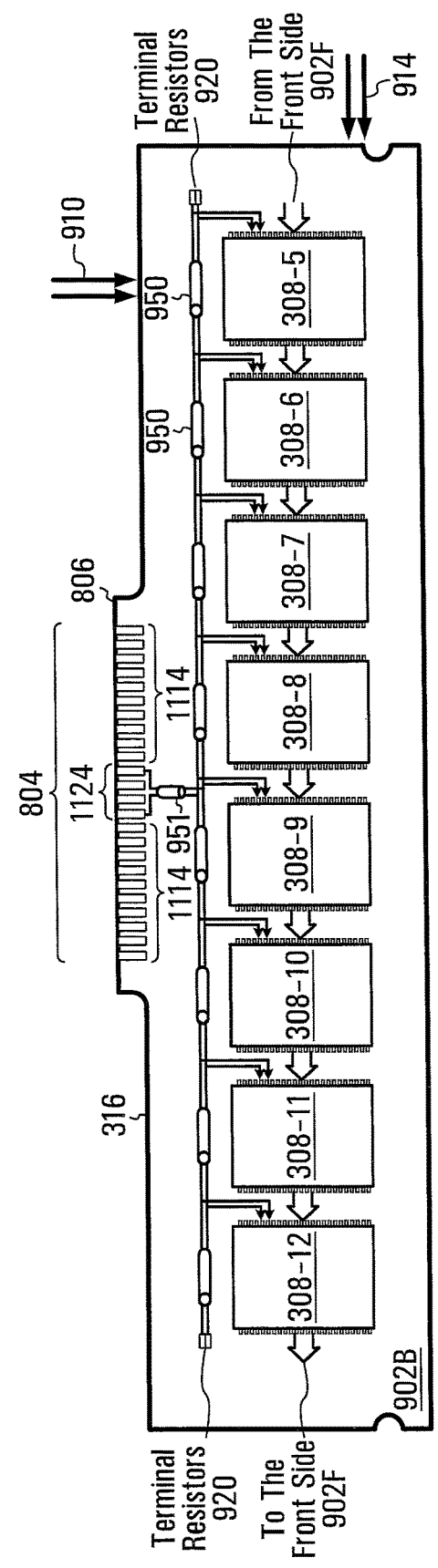
FIG. 9B illustrates a layout of non-volatile memory devices on a back face of the same non-volatile memory module whose front face is illustrated in FIG. 9A.

In one embodiment of a non-volatile memory module, shown more precisely in FIGS. 9A and 9B, the connector 806 is placed towards a central region of an edge 910 of the PCB 316, and the first non-volatile memory device 308-1 is placed towards a center of the front face 902F of the PCB 316, such that the first non-volatile memory device 308-1 is closer than any of non-volatile memory devices 308-2, . . . , 308-15 to the input pins 802 of the connector 806. Only the sixteenth non-volatile memory device 308-16 is permitted to be as close to the connector 806 (and hence to the SSD controller 28) as the first non-volatile memory device 308-1, for reasons to be explained below.

The second, third and fourth non-volatile memory devices 308-2, 308-3, 308-4 are then disposed sequentially along the front face 902F of the PCB 316 and gradually moving towards an edge 912 of the PCB 316. Then, the fifth non-volatile memory device 308-5 appears on the back face 902B of the PCB 316, close to the edge 912 of the PCB 316. From there, the fifth non-volatile memory device 308-5 is electrically connected in series to the sixth, seventh, and up to the twelfth non-volatile memory device 308-12, which appears at another edge 914 of the PCB 316, but is still on the back face 902B. Then, the thirteenth non-volatile memory device 308-13 appears on the front face 902F of the PCB 316, close to the edge 914 of the PCB 316. From there, the thirteenth non-volatile memory device 308-13 is electrically connected in series to the fourteenth, fifteenth and sixteenth non-volatile memory devices 308-14, 308-15, 308-16. The sixteenth non-volatile memory device 308-16 then appears next to the first non-volatile memory device 308-1, and is therefore close to the connector 806 in general and the output pins 804 in particular.

In FIGS. 9A and 9B, wirings 950 are used to represent portions of a conductor that runs lengthwise along the PCB 316 and distributes the clock signal and other signals carried by the second subset of input pins 1114 of the connector 806. A signal wire 951 represents the small distance between the input pins 802 of the connector 806 pins and the lengthwise conductor. Terminal resistors 920 terminate the ends of the lengthwise conductor in terminal power (VTT) sources and have resistance values each corresponding to the characteristic impedance or effective characteristic impedance of each wiring 950.

It should be appreciated that the above arrangement of the non-volatile memory devices 308-1, . . . , 308-16 limits the maximum distance between any pair of adjacent non-volatile memory devices. In addition, by placing the connector 806 near the center of the edge 910 of the PCB 316 and by placing the first non-volatile memory device 308-1 near the center of the PCB 316 itself, the above arrangement achieves balanced clock distribution and input loading in a distributed (multi-drop) clocking configuration. As a result, undesirable effects at high clock speeds (such as, for example, clock skew) can be mitigated, and the size of the valid data window is increased.

In a propagated clock configuration, the physical arrangement of FIGS. 9A and 9B can be used, as can other physical arrangements of the non-volatile memory devices 308-1, . . . , 308-16. For example, with reference now to FIGS. 11A and 11B, as well as to FIGS. 12A and 12B, there are shown two other possible physical arrangements of non-volatile memory module 314-A. These embodiments represent an option that can be chosen in the case where the clock signal used by each of the non-volatile memory devices 308-1, . . . , 308-16 is a propagated version received from a previous device in a chain rather than being distributed in a multi-drop fashion. Here, all propagated input and output signals (including the clock) are grouped together and located towards one edge of the PCB 316, while commonly electrically connected (i.e., multi-drop) signals are also grouped together but are located towards an opposite edge of the PCB 316.

Accordingly, in the present non-limiting embodiment, the input pins 802 and the output pins 804 of non-volatile memory module 314-A are distributed among a first dual-faced connector 1110 and a second dual-faced connector 1120, both of which are physical connectors. Specifically, the input pins in the first subset of input pins 1112 are disposed on the first connector 1110, while the input pins in the second subset of input pins 1122 are disposed on the second connector 1120. The input pins in both the first subset of input pins 1112 and in the second subset of input pins 1122 are accessible via the front face 902F of the PCB 316.

For their part, the output pins in the first subset of output pins 1114 are aligned with the respective input pins in the first subset of input pins 1112. Moreover, the output pins in the second subset of output pins 1124 are not only aligned with, but also are electrically connected to, respective ones of the input pins in the second subset of input pins 1122. The output pins in both the first subset of output pins 1114 and the second subset of output pins 1124 are accessible via the back face 902B of the PCB 316.

Figure 11A:
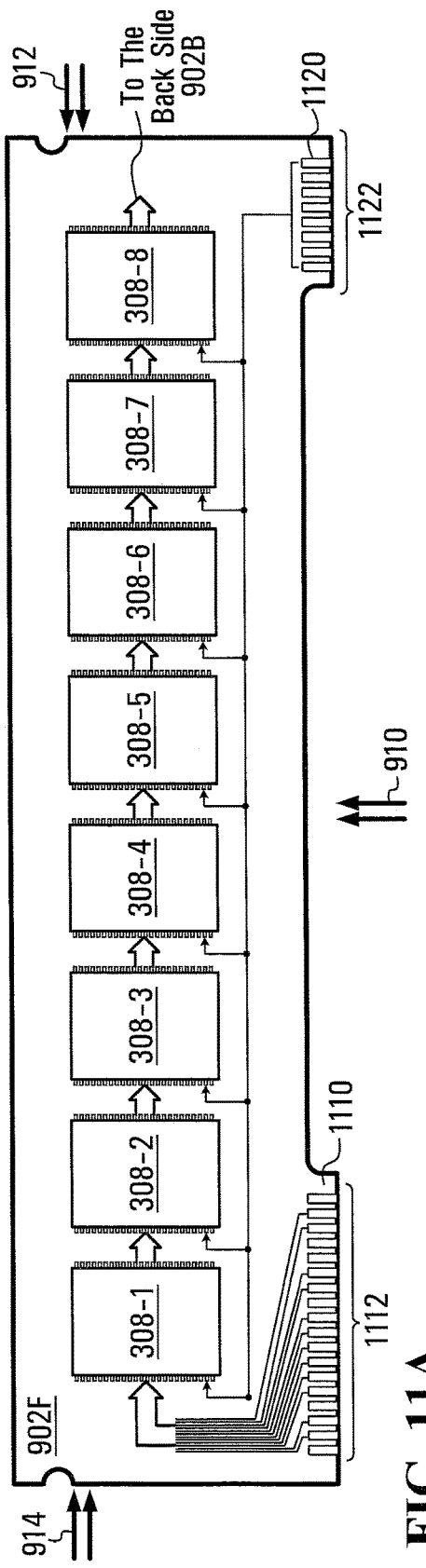
FIG. 11A illustrates a layout of non-volatile memory devices on a front face of a non-volatile memory module, in accordance with a first specific non-limiting embodiment of the present invention in which a propagated clock is provided.
Figure 11B:
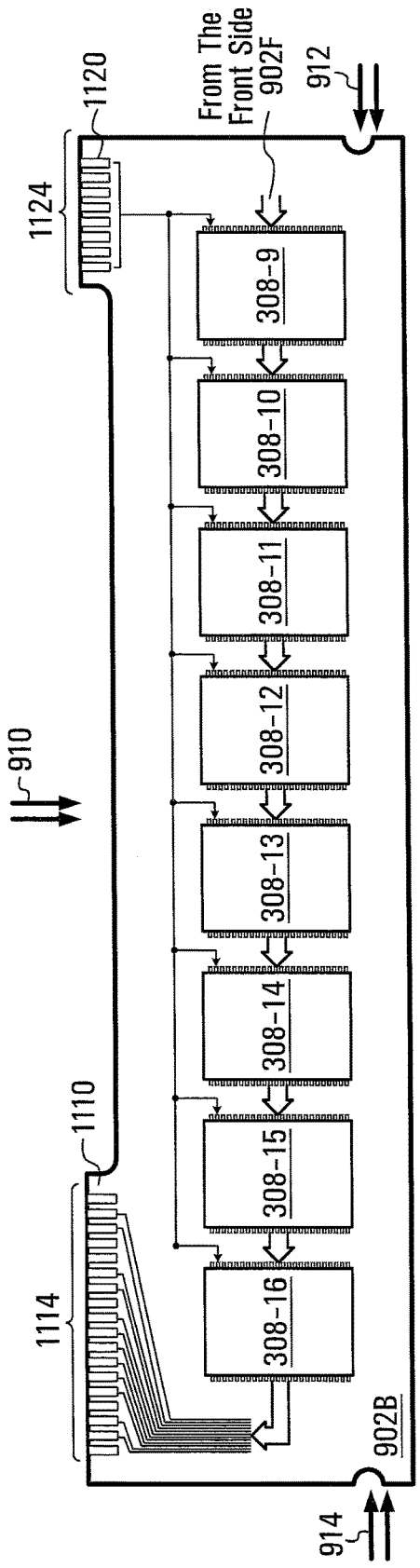
FIG. 11B illustrates a layout of non-volatile memory devices on a back face of the same non-volatile memory module whose front face is illustrated in FIG. 11A.

In the embodiment of FIGS. 11A and 11B, the first connector 1110 and the second connector 1112 are located at opposite ends of the edge 910 of the PCB 316, namely in proximity to edges 914 and 912, respectively. In contrast, in the embodiment of FIGS. 12A and 12B, the first and second connectors 1110, 1112 are located on different edges of the PCB 316, namely edges 914 and 910, respectively. What is common to both embodiments is that the first non-volatile memory device 308-1 is placed on the front face 902F of the PCB 316, in proximity to the first connector 1110, such that the first non-volatile memory device 308-1 is closer than any of non-volatile memory devices 308-2, . . . , 308-15 to connector 1110. Only the sixteenth non-volatile memory device 308-16 is permitted to be as close to the connector 1110 (and hence to the SSD controller 28) as the first non-volatile memory device 308-1, for reasons to be explained later.

Figure 12A:
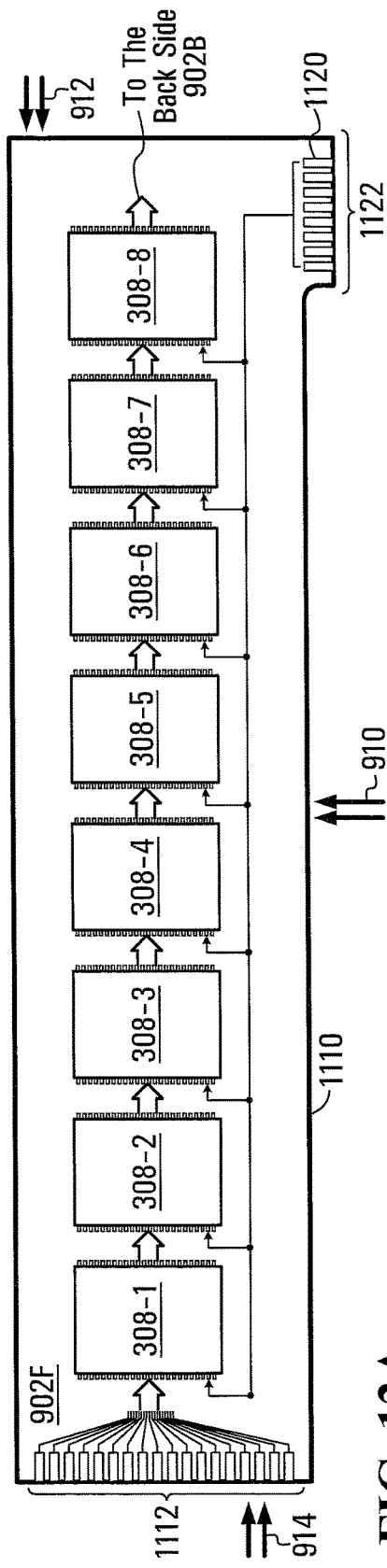
FIG. 12A illustrates a layout of non-volatile memory devices on a front face of a non-volatile memory module, in accordance with a second specific non-limiting embodiment of the present invention in which a propagated clock is provided.
Figure 12B:
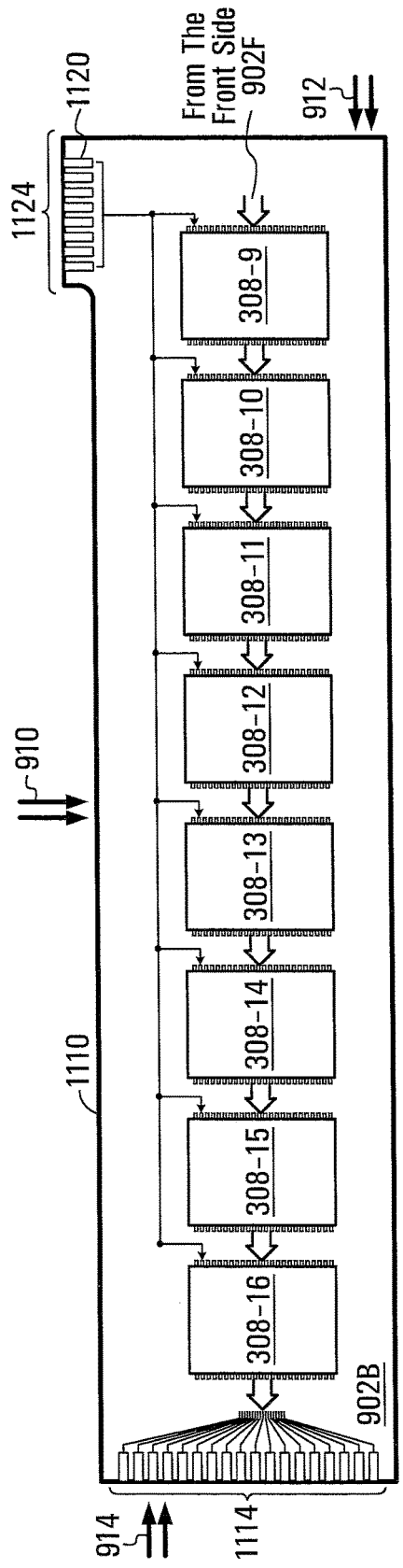
FIG. 12B illustrates a layout of non-volatile memory devices on a back face of the same non-volatile memory module whose front face is illustrated in FIG. 12A.

Continuing with the description of FIGS. 12A and 12B, the second, third, and up to the eighth non-volatile memory device 308-8 are then disposed sequentially along the front face 902F of the PCB 316 and gradually moving towards the edge 912 of the PCB 316. Then, the ninth non-volatile memory device 308-9 appears on the back face 902B of the PCB 316, close to the edge 912 of the PCB 316. From there, the ninth non-volatile memory device 308-9 is electrically connected in series to the tenth, eleventh, and up to the sixteenth non-volatile memory device 308-16, which appears back at edge 914 of the PCB 316, opposite the first non-volatile memory device 308-1. Thus, the sixteenth non-volatile memory device 308-16 is therefore as close to the first connector 1110 as the first memory device 308-1.

It should be appreciated that the arrangements of the non-volatile memory devices 308-1, . . . , 308-16 in FIGS. 11A, 11B, 12A and 12B limit the maximum distance between any pair of adjacent memory devices. Meanwhile, the distance between the input pins in the first subset of input pins 1112 and the first non-volatile memory device 308-1, as well as the distance between the last non-volatile memory device 308-16 and the output pins in the first subset of output pins 1122, are also limited, thus keeping overall latency low.

It will be appreciated that similar effects to those described above could be achieved by using only one face of the PCB 316 (e.g., the front face 902F) and by placing all of the memory devices formerly on the back face 902B (namely, non-volatile memory devices 308-5 through 308-12 in FIGS. 9A and 9B, as well as non-volatile memory devices 308-9 through 308-16 in FIGS. 11A, 11B, 12A and 12B) on a second (or third, etc.) row above or below the other memory devices on the front face 902F. Thus, instead of electrically connecting to a particular non-volatile memory device on the back face 902B, an electrical connection would be established to a different row of the PCB 316.

Figure 15:
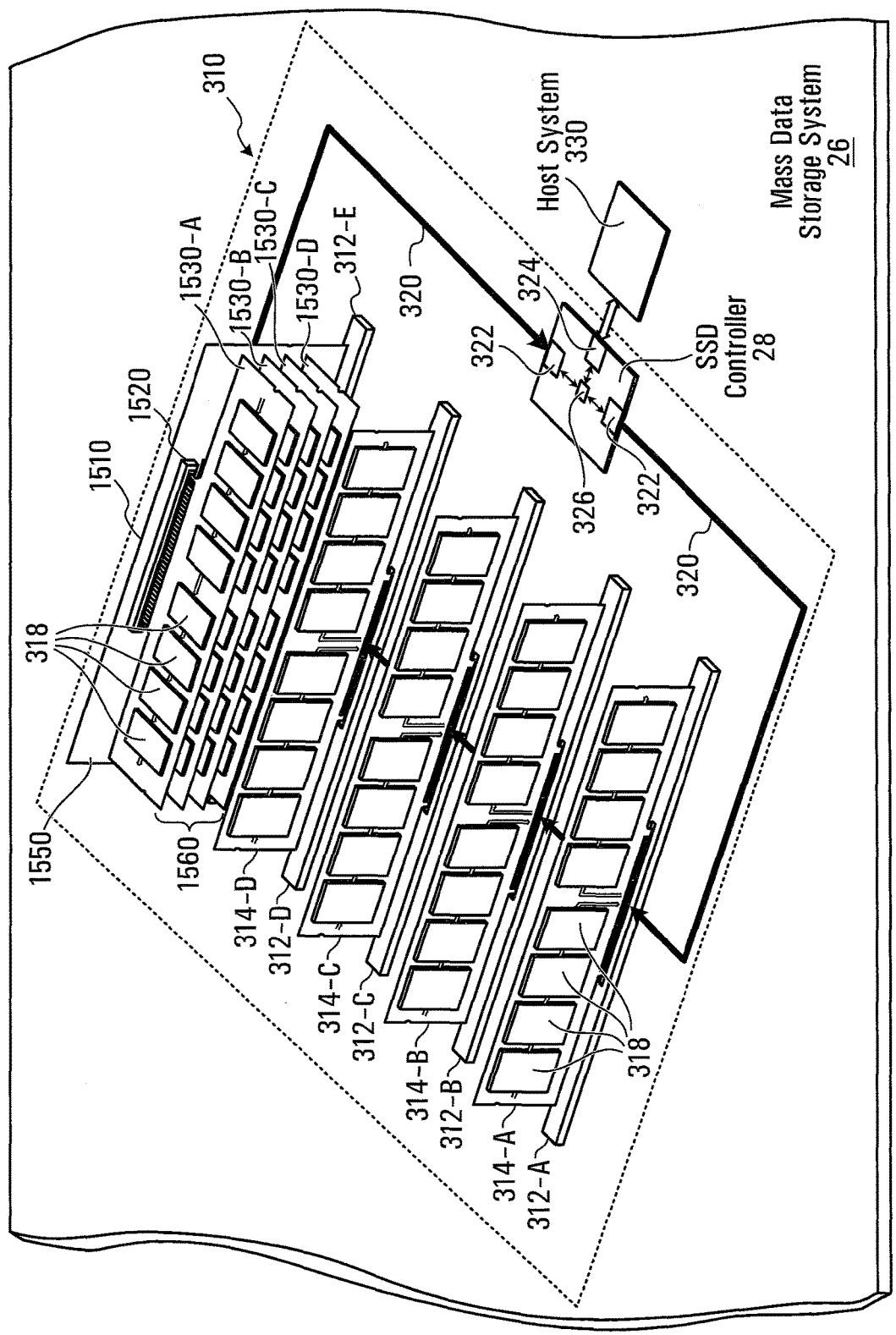
FIG. 15 is a perspective view of a mass data storage system in accordance with yet another specific non-limiting embodiment of the present invention, in which an expansion module is provided.

Reference is now made to FIG. 15, which shows a mass data storage system in accordance with an alternative embodiment of the present invention. In this embodiment, non-volatile memory modules 314-A, 314-B, 314-C, 314-D are respectively plugged into socket connectors 312-A, 312-B, 312-C, 312-D. In addition, an expansion module 1510 is plugged into socket connector 312-E. The expansion module 1510 is a special module, and includes a connection portion 1550 as well as a memory portion 1560 that is attachable to and detachable from the expansion portion 1550. The connection portion 1550 is in the form of a card and includes a physical connector (not shown) similar to connector 806, which is plugged into socket connector 312-E. The connection portion 1550 further includes a plurality of socket connectors 1520, which can be identical to socket connectors 312-A, 312-B, 312-C, 312-D, 312-E. The socket connectors 1520 are each capable of independently mating with a respective non-volatile memory sub-module which, when physically connected, will be parallel to the motherboard 310 and orthogonal to the non-volatile memory modules 314-A, 314-B, 314-C, 314-D.

The memory portion 1560 of the expansion module 1510 includes a series interconnection of non-volatile memory devices that can be distributed over one or more non-volatile memory sub-modules 1530-A, 1530-B, 1530-C, 1530-D. In a specific non-limiting embodiment, any one (or all) of the various non-volatile memory sub-modules 1530-A, 1530-B, 1530-C, 1530-D can be identical to any of the non-volatile memory modules 314-A, 314-B, 314-C, 314-D, 314-E. Accordingly, any one (or all) of the non-volatile memory sub-modules 1530-A, 1530-B, 1530-C, 1530-D can include a chain of non-volatile memory devices 318.

Figure 16:
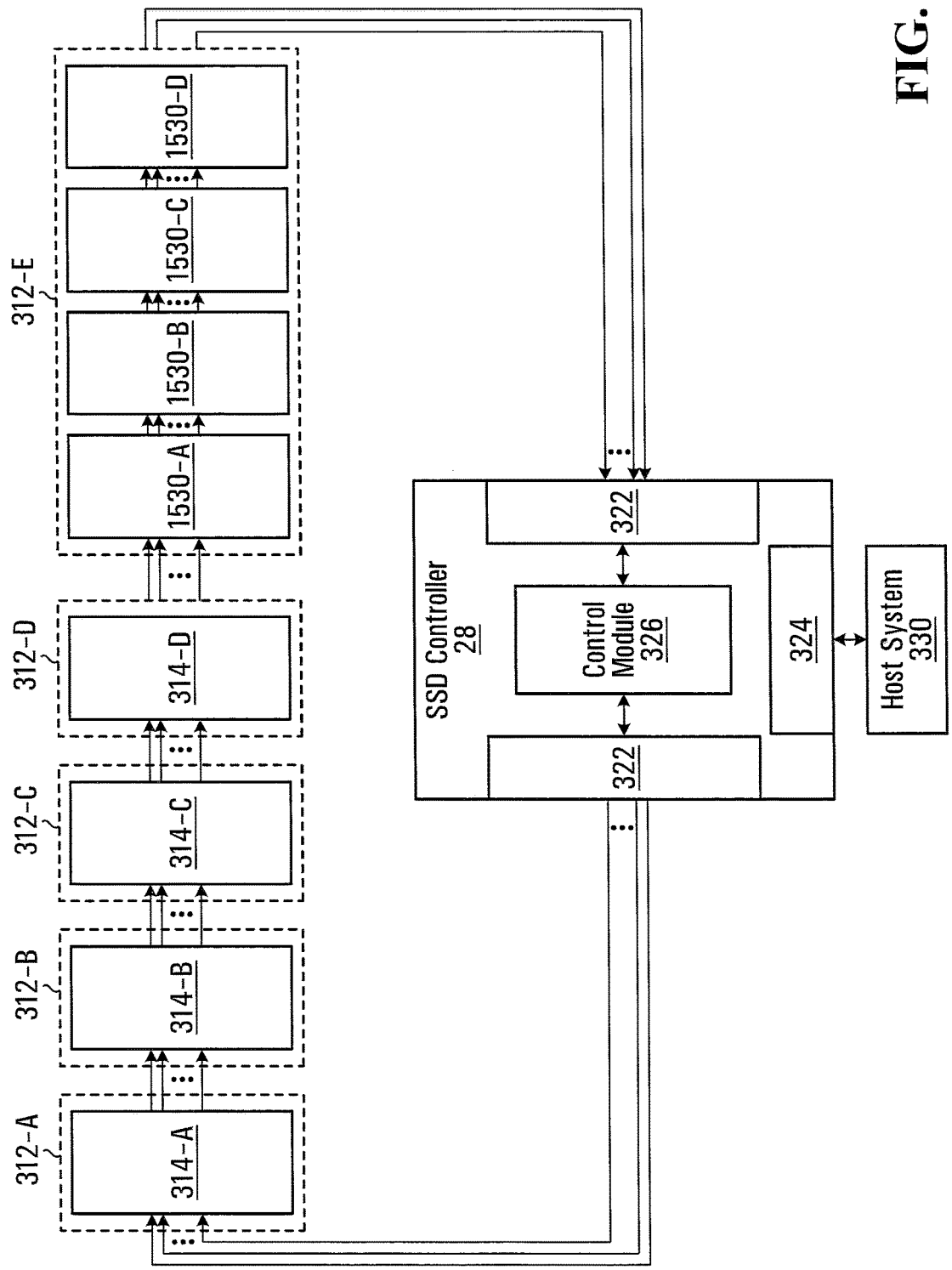
FIG. 16 is a block diagram of the mass data storage system in FIG. 14.

From an electrical communications point of view, as seen in the block diagram of FIG. 16, when the expansion module 1510 is in place, the ring 320 begins at the SSD controller 28, travels via non-volatile memory modules 314-A, 314-B, 314-C, 314-D and non-volatile memory sub-modules 1530-A, 1530-B, 1530-C, 1530-D and then returns back to the SSD controller 28. In this way, insertion of the expansion module 1510 allows the storage density of the mass data storage system to be further increased. It should be appreciated that where the socket connectors 1520 are identical to any of the socket connectors 312-A, 312-B, 312-C, 312-D, 312-E, then the ring 320 will still form a closed electrical circuit regardless of how many (or if any) of the non-volatile memory sub-modules 1530-A, 1530-B, 1530-C, 1530-D are actually plugged into respective socket connectors of the connection portion 1550.

Those skilled in the art will appreciate that the number of socket connectors 1520 on the connection portion 1550 of the expansion module 1510 is not particularly limited. Also, it should be appreciated that the expansion module 1510 could have been inserted into any one of the other socket connectors 312-A, 312-B, 312-C, 312-D of the motherboard 310, as long as there is sufficient space between adjacent socket connectors of the motherboard 310 when one of them receives the expansion module 1510 loaded with one or more non-volatile memory sub-modules. Also, it should be appreciated that any number (including all) of the socket connectors 312-A, 312-B, 312-C, 312-D, 312-E could receive respective expansion modules similar to the expansion module 1510. Also, the use of expansion modules can be applied to a multi-ring embodiment such as in FIGS. 5 and 6, thus permitting an increase in the memory capacity of any particular drive or drives.

Thus, it will be appreciated that non-volatile solid state mass storage solutions in accordance with embodiments of the present invention provide flexible expandability in terms of storage density, as well as ease of use in terms of being able to exchange modules into and out of an existing motherboard. Such a mass storage solution can replace or co-exist with conventional mass storage systems.

It should be appreciated that in some embodiments, all or part of a mass data storage system in accordance with an embodiment of the present invention can be manufactured based on a low-level hardware description obtained using a logic synthesis tool that is run on a computing device. The logic synthesis tool reads source code containing a functional description of the mass data storage system (e.g., in a language such as, for example, HDL, VHDL or Verilog, to name a few non-limiting possibilities) and outputs a definition of the physical implementation of a circuit suitable for implementing corresponding functionality.

Certain adaptations and modifications of the described embodiments can be made. Therefore, the above discussed embodiments are considered to be illustrative and not restrictive.

The invention claimed is:

1. A mass data storage system, comprising:
a memory controller for issuing and receiving signals to carry out memory operations;
a motherboard comprising at least two socket connectors serially connected to each other and each configured to provide electrical continuity of signal pathways for establishing a serially connected ring from the memory controller via each of the at least two socket connectors and back to the memory controller when empty, each of the at least two socket connectors including:
a plurality of first electrical pins positioned in opposing respective alignment with a plurality of second electrical pins, wherein the first electrical pins contact with the second electrical pins when no memory module is inserted; and
at least one non-volatile memory module comprising:
a dual-faced connector comprising a plurality of first electrical conductors disposed on a first face of the connector and a plurality of second electrical conductors disposed on a second face of the connector, the plurality of first and second electrical conductors electrically connected to a chain of serially connected non-volatile memory devices, wherein the chain of serially connected non-volatile memory devices includes:
a first non-volatile memory device having inputs coupled to the first electrical conductors for receiving the signals issued by the memory controller and having outputs for providing the signals, and
a last non-volatile memory device having inputs for receiving the signals from the first non-volatile memory device and having outputs coupled to the second electrical conductors for providing the signals;

wherein mating of the dual-faced connector with a given one of the at least two socket connectors physically separates the plurality of first electrical pins from the plurality of second electrical pins and causes the plurality of first electrical conductors to contact the plurality of first electrical pins and the plurality of second electrical conductors to contact the plurality of second electrical pins, thereby causing the chain of serially connected non-volatile memory devices to be inserted into the ring, thereby to allow the memory controller to carry out the memory operations on the non-volatile memory devices in the chain; and wherein the memory controller issues signals to said first electrical pins of a first of the at least two socket connectors and receives signals from said second electrical pins of a last of the at least two socket connectors for carrying out memory operations.

2. The mass data storage system defined in claim 1, wherein the motherboard comprises at least one additional socket connector and provides signal pathways for establishing a second ring from the memory controller via each of the at least one additional socket connector and back to the memory controller.

3. The mass data storage system defined in claim 2, wherein mating of the dual-faced connector with a given one of the at least one additional socket connector causes the chain of serially connected non-volatile memory devices to be inserted into the second ring, thereby to allow the memory controller to carry out the memory operations on the serially connected non-volatile memory devices in the chain.

4. The mass data storage system defined in claim 1, wherein a particular one of the at least one non-volatile memory module is an expansion module comprising a connection portion and a memory portion attachable to and detachable from the connection portion, the memory portion comprising the chain of serially connected non-volatile memory devices of the particular one of the at least one non-volatile memory module, the connection portion comprising the dual-faced connector of the particular one of the at least one non-volatile memory module.

5. The mass data storage system defined in claim 4, wherein the memory portion comprises at least one memory sub-module, and wherein the chain of serially connected non-volatile memory devices of the particular one of the at least one non-volatile memory module is distributed over the at least one memory sub-module.

6. The mass data storage system defined in claim 5, wherein the at least one memory sub-module comprises a plurality of memory sub-modules.

7. The mass data storage system defined in claim 6, wherein each of the memory sub-modules is independently matable with the expansion portion.

8. The mass data storage system defined in claim 1, wherein the dual-faced connector and the given one of the at least two socket connectors are configured to provide rigid support for said non-volatile memory module when said mating occurs.

9. The mass data storage system defined in claim 1, wherein the memory controller is configured to carry out the memory operations based on instructions received from a memory control hub that interfaces with a processing unit.

10. The mass data storage system defined in claim 1, wherein the memory controller is mounted on the motherboard.

11. A computing device comprising:
an input/output interface;
a main memory storing instructions;
at least one processor for executing computing operations based on instructions stored in the main memory; and
a mass data storage system electrically connected to the at least one processor, the mass data storage system comprising:
 a memory controller for issuing and receiving signals to carry out memory operations based on signals received from the at least one processor;
 a motherboard comprising at least two socket connectors serially connected to each other and each configured to provide electrical continuity of signal pathways for establishing a serially connected ring from the memory controller via each of the at least two socket connectors and back to the memory controller when empty, each of the at least two socket connectors including:
  a plurality of first electrical pins positioned in opposing respective alignment with a plurality of second electrical pins, wherein the first electrical pins contact with the second electrical pins when no memory module is inserted; and
 at least one non-volatile memory module comprising:
  a dual-faced connector comprising a plurality of first electrical conductors disposed on a first face of the connector and a plurality of second electrical conductors disposed on a second face of the connector, the plurality of first and second electrical conductors electrically connected to a chain of serially connected non-volatile memory devices, wherein the chain of serially connected non-volatile memory devices includes:
   a first non-volatile memory device having inputs coupled to the first electrical conductors for receiving the signals issued by the memory controller and having outputs for providing the signals, and
   a last non-volatile memory device having inputs for receiving the signals from the first non-volatile memory device and having outputs coupled to the second electrical conductors for providing the signals;
 wherein mating of the dual-faced connector with a given one of the at least two socket connectors physically separates the plurality of first electrical pins from the plurality of second electrical pins and causes the plurality of first electrical conductors to contact the plurality of first electrical pins and the plurality of second electrical conductors to contact the plurality of second electrical pins, thereby causing the chain of serially connected non-volatile memory devices to be inserted into the ring, thereby to allow the memory controller to carry out the memory operations on the non-volatile memory devices in the chain; and
 wherein the memory controller issues signals to said first electrical pins of a first of the at least two socket connectors and receives signals from said second electrical pins of a last of the at least two socket connectors for carrying out memory operations.

12. A server, comprising:
a network interface to enable communication with at least one client over a network;
a processing portion capable of executing at least one application and servicing requests received from said at least one client; and a mass data storage system electrically connected to the processing portion, the mass data storage system comprising:
  a memory controller for issuing and receiving signals to carry out memory operations based on signals received from the processing portion;
  a motherboard comprising at least two socket connectors serially connected to each other and each configured to provide electrical continuity of signal pathways for establishing a serially connected ring from the memory controller via each of the at least two socket connectors and back to the memory controller when empty, each of the at least two socket connectors including:
    a plurality of first electrical pins positioned in opposing respective alignment with a plurality of second electrical pins, wherein the first electrical pins contact with the second electrical pins when no memory module is inserted; and
  at least one non-volatile memory module comprising:
    a dual-faced connector comprising a plurality of first electrical conductors disposed on a first face of the connector and a plurality of second electrical conductors disposed on a second face of the connector, the plurality of first and second electrical conductors electrically connected to a chain of serially connected non-volatile memory devices, wherein the chain of serially connected non-volatile memory devices includes:
      a first non-volatile memory device having inputs coupled to the first electrical conductors for receiving the signals issued by the memory controller and having outputs for providing the signals, and
      a last non-volatile memory device having inputs for receiving the signals from the first non-volatile memory device and having outputs coupled to the second electrical conductors for providing the signals;
    wherein mating of the dual-faced connector with a given one of the at least two socket connectors physically separates the plurality of first electrical pins from the plurality of second electrical pins and causes the plurality of first electrical conductors to contact the plurality of first electrical pins and the plurality of second electrical conductors to contact the plurality of second electrical pins, thereby causing the chain of serially connected non-volatile memory devices to be inserted into the ring, thereby to allow the memory controller to carry out the memory operations on the non-volatile memory devices in the chain; and
  wherein the memory controller issues signals to said first electrical pins of a first of the at least two socket connectors and receives signals from said second electrical pins of a last of the at least two socket connectors for carrying out memory operations.

13. The mass data storage system defined in claim 1, wherein the chain of serially connected non-volatile memory devices further includes at least one intervening non-volatile memory device receiving the signals from the first non-volatile memory device and providing the signals to the last non-volatile memory device.

14. The computing device defined in claim 11, wherein the chain of serially connected non-volatile memory devices further includes at least one intervening non-volatile memory device receiving the signals from the first non-volatile memory device and providing the signals to the last non-volatile memory device.

15. The server defined in claim 12, wherein the chain of serially connected non-volatile memory devices further includes at least one intervening non-volatile memory device receiving the signals from the first non-volatile memory device and providing the signals to the last non-volatile memory device.

* * * * *